(12) United States Patent
Ishino et al.

(10) Patent No.: US 11,908,778 B2
(45) Date of Patent: Feb. 20, 2024

(54) SEMICONDUCTOR MODULE

(71) Applicant: DENSO CORPORATION, Kariya (JP)

(72) Inventors: Hiroshi Ishino, Kariya (JP); Ryota Miwa, Kariya (JP); Shoichiro Omae, Kariya (JP); Takuo Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 358 days.

(21) Appl. No.: 17/469,303

(22) Filed: Sep. 8, 2021

(65) Prior Publication Data

US 2021/0407892 A1 Dec. 30, 2021

Related U.S. Application Data

(63) Continuation of application No. PCT/JP2020/005570, filed on Feb. 13, 2020.

(30) Foreign Application Priority Data

Mar. 11, 2019 (JP) .................. 2019-043885

(51) Int. Cl.
*H01L 23/495* (2006.01)
*H01L 23/31* (2006.01)
*H01L 23/50* (2006.01)

(52) U.S. Cl.
CPC .... H01L 23/49524 (2013.01); H01L 23/3107 (2013.01); H01L 23/49568 (2013.01); H01L 23/50 (2013.01)

(58) Field of Classification Search
CPC ........... H01L 23/49524; H01L 23/3107; H01L 23/49568; H01L 23/50; H01L 23/051; H01L 2224/32245; H01L 2224/48247; H01L 2224/73265; H01L 23/4334; H01L 23/49537; H01L 23/49575; H01L 23/49562; H01L 2224/33181; H01L 2924/181; H01L 23/40; H01L 25/07; H01L 25/18

See application file for complete search history.

(56) References Cited

U.S. PATENT DOCUMENTS

2009/0002956 A1 1/2009 Suwa et al.
2010/0327654 A1 12/2010 Azuma et al.
(Continued)

FOREIGN PATENT DOCUMENTS

| JP | 4209421 B2 | 1/2009 |
| WO | 2020/184051 A1 | 9/2020 |
| WO | 2020/184053 A1 | 9/2020 |

*Primary Examiner* — Robert G Bachner
(74) *Attorney, Agent, or Firm* — POSZ LAW GROUP, PLC

(57) ABSTRACT

A semiconductor module includes: a semiconductor element having a first main electrode and a second main electrode; a first conductive member and a second conductive member connected to the first main electrode and the second main electrode, respectively, and placed to sandwich the semiconductor element; and a main terminal including a first main terminal continuous from the first conductive member and a second main terminal continuous from the second conductive member. The main terminal has a facing portion, a non-facing portion, a first connection portion, and a second connection portion. In a width direction, a formation position of the second connection portion overlaps with a formation position of the first connection portion.

9 Claims, 16 Drawing Sheets

(56) References Cited

U.S. PATENT DOCUMENTS

2016/0133597 A1 5/2016 Kouno
2017/0069562 A1 3/2017 Ide et al.
2021/0057389 A1 2/2021 Ishino (a) LOWER MOLD (b) UPPER MOLD

SEMICONDUCTOR MODULE

CROSS REFERENCE TO RELATED APPLICATIONS

The present application is a continuation application of International Patent Application No. PCT/JP2020/005570 filed on Feb. 13, 2020, which designated the U.S. and claims the benefit of priority from Japanese Patent Application No. 2019-043885 filed on Mar. 11, 2019. The entire disclosures of all of the above applications are incorporated herein by reference.

TECHNICAL FIELD

The present disclosure relates to a semiconductor module.

BACKGROUND

There has been known a semiconductor module including a semiconductor element having main electrodes formed on both surfaces, conductive members placed to sandwich the semiconductor element, and main terminals connected with the main electrodes, respectively.

SUMMARY

The present disclosure provides a semiconductor module including: a semiconductor element having a first main electrode and a second main electrode; a first conductive member and a second conductive member connected to the first main electrode and the second main electrode, respectively, and placed to sandwich the semiconductor element; and a main terminal including a first main terminal continuous from the first conductive member and a second main terminal continuous from the second conductive member. The main terminal has a facing portion, a non-facing portion, a first connection portion, and a second connection portion. In a width direction, a formation position of the second connection portion overlaps with a formation position of the first connection portion.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
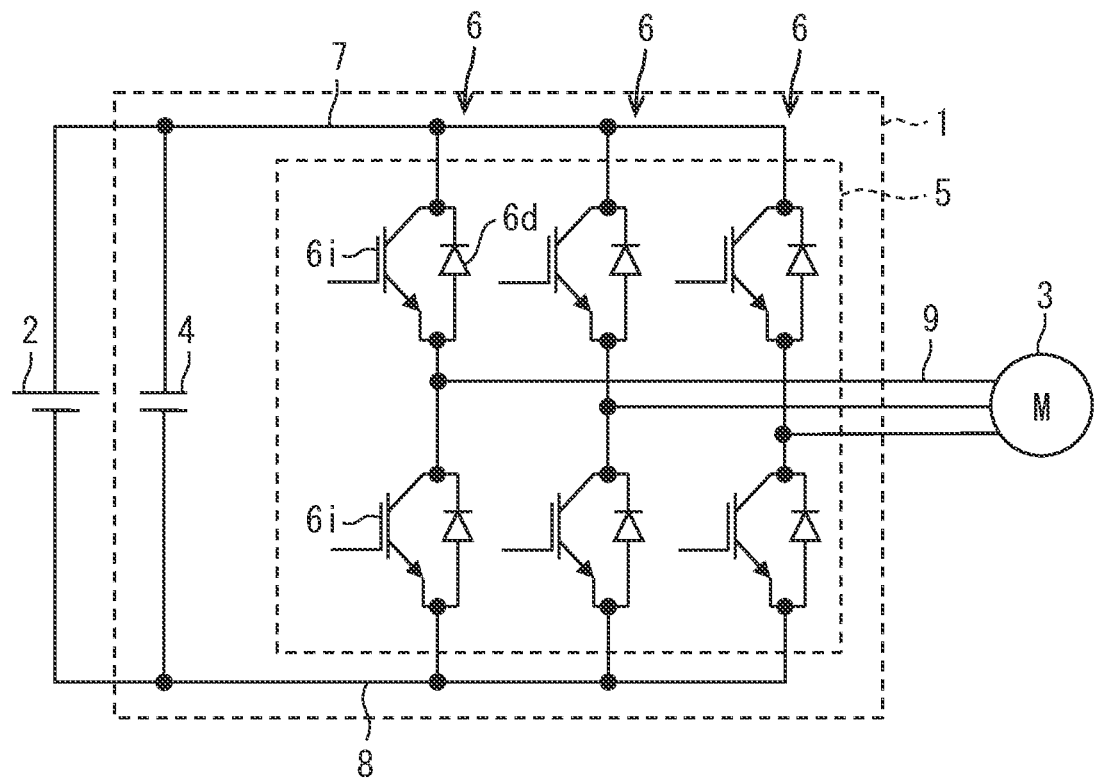
FIG. 1 is a diagram showing a schematic configuration of an electric power conversion device to which a semiconductor module of a first embodiment is applied.

A semiconductor module according to an example includes a semiconductor element having main electrodes formed on both surfaces, conductive members, and main terminals. The semiconductor module includes, as the conductive members, a first conductive member and a second conductive member. The first conductive member and the second conductive member are placed so as to sandwich the semiconductor element. The main terminal extends from the conductive member. The first conductive member is continuous from the first main terminal, and the second conductive member is continuous from the second main terminal.

In the semiconductor module described above, the first main terminal and the second main terminal are arranged side by side in a width direction. The first main terminal and the second main terminal are placed so that not plate surfaces but side surfaces face each other. It is required to further reduce the inductance.

A semiconductor module according to an aspect of the present disclosure includes: a semiconductor element having one surface and a back surface opposite to the one surface, and including a first main electrode placed on the one surface and a second main electrode placed on the back surface; a conductive member placed to sandwich the semiconductor element, and including a first conductive member placed close to the one surface and connected to the first main electrode, and a second conductive member placed close to the back surface and connected to the second main electrode; and a main terminal extending from the conductive member and including a first main terminal continuous from the first conductive member and a second main terminal continuous from the second conductive member.

The main terminal has a facing portion, a non-facing portion, and a connection portion. The facing portion is placed to cancel a magnetic flux generated when a main current flows, and is a portion where a plate surface of the first main terminal and a plate surface of the second main terminal face each other with a predetermined gap therebetween. The non-facing portion is continuous from the facing portion of the first main terminal on a side opposite to the first conductive member. The connection portion includes a first connection portion formed on the plate surface of the first main terminal in the non-facing portion of the first main terminal, and a second connection portion formed on another plate surface of the second main terminal opposite to the plate surface facing the first main terminal and formed in at least the facing portion of the second main terminal. In a width direction orthogonal to an arrangement direction in which the facing portion and the non-facing portion of the first main terminal are arranged, a formation position of the second connection portion overlaps with a formation position of the first connection portion.

According to the semiconductor module described above, in the facing portion, the plate surfaces of the first main terminal and the second main terminal face each other with the predetermined gap therebetween. Due to the facing placement of the plate surfaces, it is possible to reduce the inductance.

Further, the first main terminal includes the non-facing portion, and the connection portion is formed at the non-facing portion. Thereby, while the facing portion is secured, the formation positions of the first connection portion and the second connection portion can be overlapped in the width direction. Due to the overlap between the first connection portion and the second connection portion, it is possible to reduce the inductance as compared with a configuration where the first connection portion and the second connection portion do not overlap with each other.

Multiple embodiments will be described with reference to the drawings. In the embodiments, functionally and/or structurally corresponding parts are denoted by the same reference numerals. In the following description, a thickness direction of a semiconductor element is shown as a Z direction and a direction orthogonal to the Z direction is shown as an X direction. A direction orthogonal to both of the Z direction and the X direction is shown as a Y direction. Unless otherwise specified, a shape along an XY plane defined by the X direction and the Y direction is a planar shape.

First Embodiment

First, an electric power conversion device to which a semiconductor module is applied will be described with reference to FIG. 1.

<Schematic Configuration of Electric Power Conversion Device>

An electric power conversion device 1 shown in FIG. 1 is mounted on, for example, an electric vehicle or a hybrid vehicle. The electric power conversion device 1 converts a DC voltage supplied from a DC power source 2 mounted on the vehicle into three-phase AC and outputs it to a three-phase AC type motor 3. The motor 3 functions as a travel driving source of the vehicle. The electric power conversion device 1 can also convert an electric power generated by the motor 3 into a direct current and charge a DC power supply 2. The electric power conversion device 1 is capable of bidirectional power conversion.

The electric power conversion device 1 includes a smoothing capacitor 4 and an inverter 5 as a power converter. A positive electrode terminal of the smoothing capacitor 4 is connected to a positive electrode of the DC power source 2, which is a high potential side electrode of the DC power source 2. A negative electrode terminal of the smoothing capacitor 4 is connected to a negative electrode of the DC power source 2, which is a low potential side electrode of the DC power source 2. The inverter 5 converts the input DC electric power into a three-phase AC having a predetermined frequency, and outputs the three-phase AC to the motor 3. The inverter 5 converts the AC electric power generated by the motor 3 into a DC electric power. The inverter 5 corresponds to a DC-AC converter.

The inverter 5 includes upper-lower arm circuits 6 for three phases. In the upper-lower arm circuit 6 of each phase, two arms are connected in series between a high potential power source line 7 and a low potential power source line 8. The high potential power source line 7 is a power source line on a positive electrode side, and the low potential power source line 8 is a power source line on a negative electrode side. In the upper-lower arm circuit 6 of each phase, a connection point between the upper arm and the lower arm is connected to an output line 9 to the motor 3.

In this embodiment, an n-channel type insulated gate bipolar transistor 6i (hereinafter referred to as an IGBT 6i) is adopted as a switching element constituting each arm. FWDs 6d as freewheel diodes are connected in reverse parallel to each IGBT 6i. The upper-lower arm circuit 6 for one phase is configured to have two IGBTs 6i. In the upper arm, collector electrodes of the IGBTs 6i are electrically connected to the high potential power source line 7. In the lower arm, emitter electrodes of the IGBTs 6i are electrically connected to the low potential power source line 8. The emitter electrodes of the IGBTs 6i in the upper arm and the collector electrodes of the IGBTs 6i in the lower arm are connected to each other.

In addition to the smoothing capacitor 4 and the inverter 5 described above, the electric power conversion device 1 may include a converter which is a power converter different from the inverter 5, a drive circuit for the switching element constituting the inverter 5 and the converter, and the like. The converter is a DC-DC converter that converts a DC voltage into the DC voltage having a different value.

<Schematic Configuration of Semiconductor Module>

Next, a schematic configuration of the semiconductor module will be described with reference to FIGS. 2 to 6.

Figure 4:
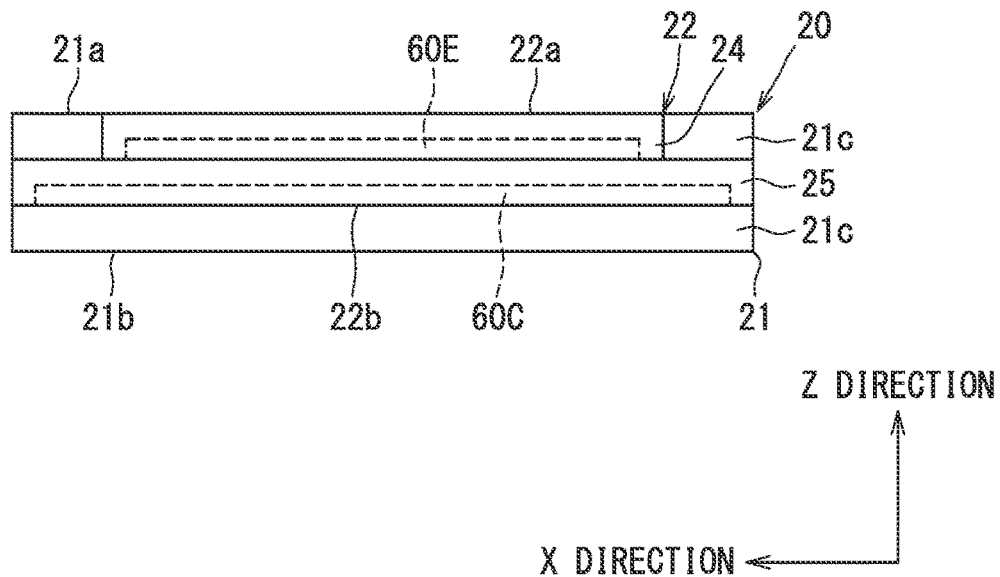
FIG. 4 is a plan view of the semiconductor module as viewed from the main terminal side.

As shown in FIGS. 2 to 6, the semiconductor module 10 includes a sealing resin body 20, a semiconductor element 30, a heat sink 40, a terminal 50, main terminals 60, and a signal terminal 70. In FIG. 4, the sealing resin body 20 is shown in a simplified manner.

The sealing resin body 20 includes a main portion 21 and a terminal covering portion 22 connected to the main portion 21. The main portion 21 seals the semiconductor element 30. The main portion 21 seals at least a part of each heat sink 40. The terminal covering portion 22 seals a part of the main terminal 60. The main portion 21 and the terminal covering portion 22 may be integrally molded. The main portion 21 may be a primary molded body, and the terminal covering portion 22 may be a secondary molded body with respect to the main portion 21.

In the present embodiment, the main portion 21 and the terminal covering portion 22 are integrally molded by using the same material. The sealing resin body 20 is made of, for example, an epoxy resin. The sealing resin body 20 is molded by, for example, a transfer molding method.

The main portion 21 has a substantially rectangular plane shape. The main portion 21 has one surface 21a and a back surface 21b opposite to the one surface 21a in the Z direction. The one surface 21a and the back surface 21b are flat surfaces, for example. The main portion 21 has a side surface connecting the one surface 21a and the back surface 21b. The main portion 21 has a side surface 21c from which the main terminal 60 projects to the outside and a side surface 21d from which the signal terminal 70 projects to the outside. The side surface 21d is a surface opposite to the side surface 21c. The terminal covering portion 22 is connected to the side surface 21c. Details of the terminal covering portion 22 will be described later.

In the semiconductor element 30, the element is formed on a semiconductor substrate such as Si, SiC, or GaN. The semiconductor element 30 is placed between a pair of heat sinks 40. The semiconductor module 10 includes at least one semiconductor element 30. In the present embodiment, the IGBT 6i and the FWD 6d are formed on the same semiconductor substrate. As described above, RC (Reverse Conducting)-IGBT is adopted as the semiconductor element 30. The semiconductor element 30 constitutes one of the above-described arms. The semiconductor element 30 is also referred to as a semiconductor chip.

The semiconductor element 30 has a vertical structure so that the main current flows in the Z direction. Although not shown, the semiconductor element 30 has a gate electrode. The gate electrode has, for example, a trench structure. Further, the semiconductor element 30 has main electrodes 31 on both sides thereof in the thickness direction, that is, in the Z direction. Specifically, as the main electrodes 31, an emitter electrode 31e is provided on one surface side, and a collector electrode 31c is provided on the back surface side, which is the opposite surface to the one surface side. The emitter electrode 31E also serves as an anode electrode of the FWD 6d. The collector electrode 31c also serves as a cathode electrode of the FWD 6d. The emitter electrode 31e corresponds to a first main electrode, and the collector electrode 31c corresponds to a second main electrode.

The semiconductor element 30 has a substantially rectangular shape in a plane. A pad 32, which is an electrode for signal, is formed on a formation surface of the emitter electrode 31e in the semiconductor element 30. The pad 32 is formed at a position different from that of the emitter electrode 31E. The pad 32 is electrically isolated from the emitter electrode 31E. The pad 32 is formed at an end on the side opposite to the formation area of the emitter electrode 31E in the Y direction.

The semiconductor element 30 has, for example, five pads 32. Specifically, the five pads 32 are provided fora gate electrode, a Kelvin emitter for detecting a potential of the emitter electrode 31E, a current sense, an anode potential of a temperature sensor (temperature-sensitive diode) for detecting a temperature of the semiconductor element 30, and a cathode potential. The five pads 32 are collectively formed on one end side in the Y direction in the semiconductor element 30 having a substantially rectangular planar shape, and are formed side by side in the X direction.

The heat sink 40 is the conductive member placed so as to sandwich the semiconductor element 30 in the Z direction. The heat sinks 40 have a function of dissipating heat of the semiconductor element 30 to the outside of the semiconductor module 10. That is, the heat sinks 40 function as a wiring for the main electrode 31. Therefore, in order to secure thermal conductivity and electrical conductivity, the heat sinks 40 are made of at least a metal material. As the heat sinks 40, for example, a metal plate, a DBC (Direct Bonded Copper) substrate, or the like can be employed. The heat sinks 40 are provided so as to accommodate the semiconductor element 30 inside in a projection view from the Z direction. The heat sinks 40 have a substantially rectangular shape in plane. The thickness of the heat sink 40 is kept substantially constant, and the plate thickness direction is substantially parallel to the Z direction.

The heat sinks 40 are provided in pairs so as to sandwich the semiconductor element 30. The semiconductor module 10 has, as a pair of heat sinks 40, a heat sink 40E placed close to the emitter electrode 31E and a heat sink 40C placed close to the collector electrode 31c. The heat sink 40E corresponds to a first conductive member, and the heat sink 40C corresponds to a second conductive member. The heat sinks 40C and 40E substantially coincide with each other in the projection view from the Z direction.

In the Z direction, the heat sink 40E has a connection surface 41E close to the semiconductor element 30 and a heat dissipation surface 42E opposite to the connection surface 41E. In the Z direction, the heat sink 40C has a connection surface 41C close to the semiconductor element 30 and a heat dissipation surface 42C opposite to the connection surface 41C.

The connection surface 41E of the heat sink 40E is connected to the terminal 50 via the solder 80. The terminal 50 is interposed between the semiconductor element 30 and the heat sink 40E. The terminal 50 is located in the middle of a thermal conduction and electrical conduction path of the emitter electrode 31E of the semiconductor element 30 and the heat sink 40E, and therefore the terminal 50 is made of at least a metal material in order to ensure the thermal conductivity and electrical conductivity. The terminal 50 is place to face the emitter electrode 31E. The terminal 50 has a substantially rectangular shape in a plane. In the terminal 50, a surface opposite to a surface close to the heat sink 40E is connected to the emitter electrode 31E via the solder 81. The connection surface 41C of the heat sink 40C is connected to the collector electrode 31C of the semiconductor element 30 via the solder 82.

At least a part of each of the heat sinks 40C and 40E is sealed by the main portion 21 of the sealing resin body 20. In this embodiment, the heat dissipation surface 42E of the heat sink 40E is exposed from the sealing resin body 20. The heat dissipation surface 42E is substantially flush with the one surface 21a. A portion of the surface of the heat sink 40E excluding a connection portion with the solder 80, the heat dissipation surface 42E, and a connection portion with the main terminal 60 is covered with the sealing resin body 20. Similarly, the heat dissipation surface 42C of the heat sink 40C is exposed from the sealing resin body 20. The heat dissipation surface 42C is substantially flush with the back surface 21b. A portion of the surface of the heat sink 40C excluding a connection portion with the solder 82, the heat dissipation surface 42C, and a connection portion with the main terminal 60 is covered with the sealing resin body 20.

The main terminal 60 is a terminal through which a main current flows among external connection terminals for electrically connecting the semiconductor module 10 and an external device. The main terminal 60 is connected to the corresponding heat sink 40. In the present embodiment, the main terminal 60 is connected to the heat sink 40 inside the main portion 21 of the sealing resin body 20. The main terminal 60 extends from the corresponding heat sink 40, and projects to the outside of the main portion 21.

The main terminal 60 is electrically connected to the main electrode 31 of the semiconductor element 30. The semiconductor module 10 includes, as the main terminal 60, a main terminal 60E electrically connected to the emitter electrode 31E and a main terminal 60C electrically connected to the collector electrode 31C. The main terminal 60E corresponds to a first main terminal, and the main terminal 60C corresponds to a second main terminal. The main terminal 60E is also referred to as an emitter terminal, and the main terminal 60C is also referred to as a collector terminal.

The main terminal 60E is continuous from the heat sink 40E. The main terminal 60E extends from the heat sink 40E in the Y direction, and projects from the side surface 21c to the outside of the main portion 21. The main terminal 60C is connected to the heat sink 40C. The main terminal 60C extends from the heat sink 40C in a direction that is the Y direction and same as that in which the main terminal 60E extends, and projects to the outside of the main portion 21 from the same side surface 21c as that from which the main terminal 60E projects.

In the present embodiment, the main terminals 60C and 60E are connected to side surfaces 43C and 43E of the corresponding heat sinks 40C and 40E, respectively. The side surfaces 43C and 43E are surfaces close to the side surface 21c in the Y direction. The main terminals 60C and 60E are respectively connected to the heat sinks 40C and 40E on the same side in the Y direction. The main terminals 60C and 60E extend in the substantially same direction over their entire length.

The main terminal 60 is integrally provided with the heat sink 40 by processing the same metal plate, for example. The main terminal 60 may be connected to the corresponding heat sink 40 by joining. The main terminal 60E is thinner than the heat sink 40E. The main terminal 60C is thinner than the heat sink 40C. The plate thicknesses of the main terminals 60C and 60E are almost constant over the entire area, and the plate thicknesses of the main terminals 60C and 60E are substantially same. Details of the main terminal 60 will be described later.

The signal terminal 70 is a terminal electrically connected to the pad 32 of the semiconductor element 30 among the external connection terminals. The signal terminal 70 of the present embodiment is connected to the pad 32 via the bonding wire 83. The signal terminal 70 is connected to the bonding wire 83 inside the main portion 21. The signal terminal 70 projects from the side surface 21d to the outside of the main portion 21 (sealing resin body 20). The signal terminal 70 extends in a direction that is the Y direction and away from the main terminal 60 with respect to the semiconductor element 30. The reference numeral of 71 is a suspension lead. In the lead frame before the tie bar is removed, the signal terminal 70 is fixed to a suspension lead 71 via the tie bar (not shown).

In the semiconductor module 10 configured as described above, the sealing resin body 20 integrally seals the semiconductor element 30 and a part of each heat sink 40, the terminal 50 and a part of each main terminal 60, and a part of the signal terminal 70. That is, elements configuring one arm are sealed. Therefore, the semiconductor module 10 is also referred to as a 1 in 1 package.

The heat dissipation surface 42E of the heat sink 40E is substantially flush with the one surface 21a of the main portion 21 of the sealing resin body 20. The heat dissipation surface 42C of the heat sink 40C is substantially flush with the back surface 21b of the main portion 21. The semiconductor module 10 has a double-sided heat dissipation structure in which the heat dissipation surfaces 42C and 42E are both exposed from the sealing resin body 20. The semiconductor module 10 can be formed, for example, by cutting the heat sinks 40 together with the sealing resin body 20. Further, the sealing resin body 20 may be molded with the heat dissipation surfaces 42C and 42E in contact with the cavity wall surface of the mold for molding the sealing resin body 20.

<Main Terminal and Terminal Covering Portion>

Figure 7:
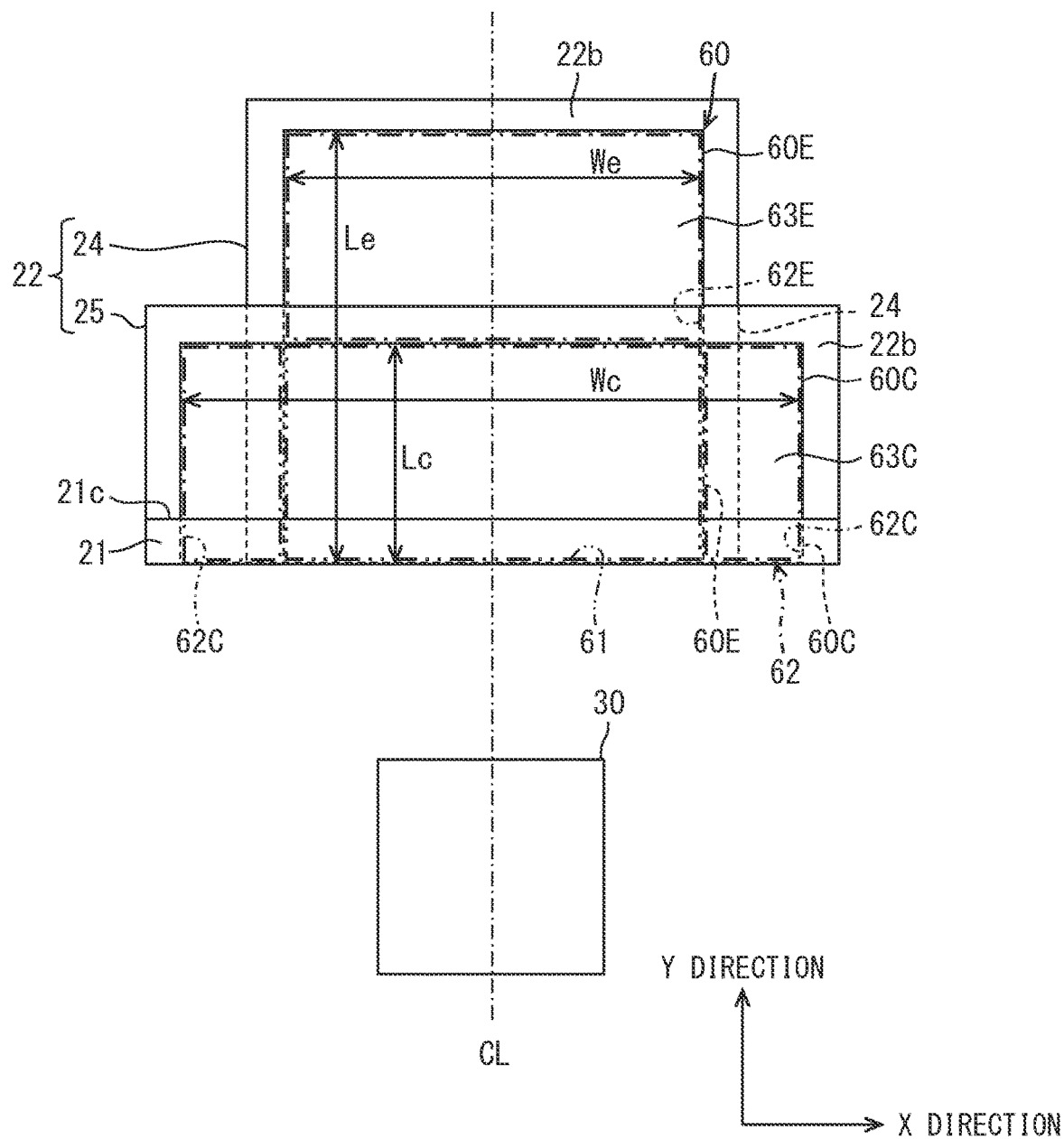
FIG. 7 is a plan view showing a positional relationship between a main terminal and an exposed portion.

Next, the main terminal 60 and the terminal covering portion 22 will be described in detail with reference to FIGS. 2 to 8. FIG. 7 is a schematic plan view showing a positional relationship of the main terminal including the exposed portion. FIG. 7 shows the semiconductor element 30, for convenience, in order to show the positional relationship between an element center and the exposed portion.

As shown in FIGS. 3, 4, 6, and 7, the main terminals 60C and 60E are placed at different positions in the Z direction. The main terminal 60E is placed at a position closer to the one surface 21a of the main portion 21 than the main terminal 60C, and the main terminal 60C is placed at a position closer to the back surface 21b of the main portion 21. The main terminal 60 has a facing portion 61, a non-facing portion 62, and an exposed portion 63.

The facing portion 61 is a portion that faces and is separated from the side surface of the main terminal 60C or the main terminal 60E. In FIG. 7, a portion surrounded by a long dashed double-dotted line is the facing portion 61. Hereinafter, in the main terminals 60C and 60E, portions constituting the facing portion 61 may be also referred to as facing portions 61C and 61E. The facing portions 61C and 61E are placed so as to cancel each of the magnetic fluxes generated when a main current flows. In order to enhance the effect of the magnetic flux cancellation, it is preferable to place the facing portions so that the direction of the main current is substantially reversed. That is, the extending directions of the main terminals 60C and 60E may be substantially same in the facing portion 61. The plate surface is a surface in the plate thickness direction of each main terminal 60. The facing portion 61 is a portion where the main terminals 60C and 60E overlap each other in the projection view from the Z direction. The facing portion 61 may be also referred to as an overlapping portion or a lamination portion.

In the present embodiment, the extending directions of the main terminals 60C and 60E in the facing portions 61C and 61E are substantially parallel to the Y direction. The boundaries between the main terminals 60C and 60E and the corresponding heat sinks 40C and 40E are located at the substantially same positions in the Y direction. The facing portions 61C and 61E are continuous from the corresponding heat sinks 40C and 40E, and there are no non-facing portions between the facing portions 61C and 61E and the heat sinks 40C and 40E. That is, the facing portion 61 is provided adjacent to the heat sink 40.

The main terminal 60 has a bent portion. At the main portion of the facing portion 61, a facing distance between the facing portions 61C and 61E in the Z direction is shorter than a facing distance between the heat sinks 40C and 40E, that is, a distance between the connection surfaces 41C and 41E. In the present embodiment, the main terminals 60C and 60E have two bent portions. Each bent portion is placed in the main portion 21. A portion that overlaps with each other and is on the projection tip side with respect to the bent portions 64C and 64E farther from the heat sink 40 is the main portion of the facing portion 61. On the projection tip side with respect to the bent portions 64C and 64E, the plate thickness direction of each of the main terminals 60C and 60E is substantially parallel to the Z direction, and a gap between the main terminals 60C and 60E is substantially constant.

The other one of the bent portions is provided at the end portion close to the heat sink 40. The main terminals 60C and 60E are substantially flush with the connection surfaces 41C and 41E, and are continuous from the corresponding heat sinks 40C and 40E. Thereby, the facing distances between the facing portions 61C and 61E are set to be equal to or less than the facing distances between the heat sinks 40C and 40E in the portions overlapping with each other in a region from the heat sinks 40C and 40E to the bent portions 64C and 64E.

The non-facing portion 62 is a portion of the main terminal 60 where the plate surfaces do not face each other. The non-facing portion 62 is a portion on which one of the main terminal 60C and the main terminal 60E is placed in the plan view from the Z direction. The non-facing portion 62 may be also referred to as a non-overlapping portion or a non-lamination portion. The non-facing portion 62 is continuous from the facing portion 61.

The main terminal 60 includes, as the non-facing portion 62, at least, the non-facing portion 62E continuous from the facing portion 61E. The non-facing portion 62E is continuous from the facing portion 61E on the side opposite to the heat sink 40E. For example, the facing portion 61 has a first end and a second end opposite to the first end in the Y direction, and the first end is close to the heat sink 40E and the second end is connected to the facing portion 61E. The non-facing portion 62E corresponds to a non-facing portion of the first main terminal and a first non-facing portion. In FIG. 7, a portion that is on the main terminal 60E and is surrounded by a dashed dotted line is the non-facing portion 62E.

In the Z direction, the main terminal 60C is not placed directly on the non-facing portion 62E. The main terminal 60E extends to an area where the main terminal 60E does not face the main terminal 60C. The non-facing portion 62E extends from the facing portion 61E in the Y direction. The arrangement direction of the facing portion 61E and the non-facing portion 62E is substantially parallel to the Y direction. The arrangement direction of the facing portion 61E and the non-facing portion 62E coincides with the extending direction of the main terminal 60E. The plate thickness direction of the non-facing portion 62E is substantially parallel to the Z direction. The main terminal 60E extends with a substantially constant width. The main terminal 60E has a substantially rectangular plane shape. In the main terminal 60E, a portion close to the heat sink 40E constitutes the facing portion 61E, and a projection tip side portion that is the remaining portion constitutes the non-facing portion 62E. As shown in FIG. 7, an extension length Le of the main terminal 60E is longer than an extension length Lc of the main terminal 60C.

In the present embodiment, the main terminal 60 has non-facing portions 62c continuous from a facing portion 61C. The non-facing portions 62c are continuous from both ends of the facing portion 61C in the width direction so as to sandwich the facing portion 61. The width direction is a direction orthogonal to the arrangement direction of the facing portion 61E and the non-facing portion 62E. In the present embodiment, the width direction is substantially parallel to the X direction. One of the non-facing portions 62c is continuous from one end of the facing portion 61C in the X direction, and the other of the non-facing portions 62c is continuous from the other end of the facing portion 61C. In FIG. 7, a portion surrounded by a dashed dotted line on the main terminal 60C is the non-facing portion 62c.

In the Z direction, directly on the non-facing portion 62c, the main terminal 60E is not placed. The non-facing portions 62C extend from both ends of the facing portion 61C in the X direction. The plate thickness direction of the non-facing portion 62C is substantially parallel to the Z direction. In the Y direction, one end of the non-facing portion 62C is continuous from the heat sink 40C. In the Y direction, the extension length of the non-facing portion 62c is substantially equal to the extension length of the facing portion 61C. The main terminal 60C extends with a substantially constant width. The main terminal 60C has a substantially rectangular plane shape. In the main terminal 60C, a central portion in the X direction constitutes the facing portion 61C, and the both end portions that are the remaining portions constitute the non-facing portions 62c. As shown in FIG. 7, a width We of the main terminal 60C is longer than a width We of the main terminal 60E.

The exposed portion 63 is a connection portion with the outside, the connection portion being formed at a plate surface of the main terminal 60. The exposed portion 63 is locally exposed from the terminal covering portion 22 of the sealing resin body 20 in the main terminal 60, and is a connection region connected with the outside. The main terminal 60 has, as the exposed portion 63, an exposed portion 63E formed at the main terminal 60E and an exposed portion 63C formed at the main terminal 60C. When the semiconductor element 30 constitutes the upper arm, a bus bar constituting the high potential power source line 7 is connected to the exposed portion 63C, and a bus bar corresponding to the output line 9 is connected to the exposed portion 63E. When the semiconductor element 30 constitutes the lower arm, a bus bar constituting the output line 9 is connected to the exposed portion 63C, and a bus bar corresponding to the low potential power source line 8 is connected to the exposed portion 63E. The exposed portion 63 corresponds to a connection portion. The exposed portion 63E corresponds to a first connection portion, and the exposed portion 63C corresponds to a second connection portion.

The exposed portion 63E is formed at the plate surface of the non-facing portion 62E. The exposed portion 63E is formed at a position where the exposed portion 63E does not overlap with the main terminal 60C. In the Y direction, the exposed portion 63E is formed at a position separated from the semiconductor element 30, and a distance between the exposed portion 63E and the semiconductor element 30 is longer than a distance between the exposed portion 63C and the semiconductor element 30. In the present embodiment, in the non-facing portion 62E, a portion within a predetermined range from the projection tip (protrusion tip) of the main terminal 60E is the exposed portion 63E, and the remaining portion close to the facing portion 61E is covered by the terminal covering portion 22. The exposed portion 63E is formed at a plate surface close to the back surface 21b. The width of the exposed portion 63E substantially coincides with a width of the non-facing portion 62E, that is, the width of the main terminal 60E.

The exposed portion 63C is formed at, at least, the plate surface of facing portion 61C in the main terminal 60C. The exposed portion 63C is formed at a plate surface opposite to a surface facing the main terminal 60E among plate surfaces of the facing portion 61C. In the Y direction, the exposed portion 63C is formed at a position closer to the semiconductor element 30 than the exposed portion 63E. A formation position in the X direction that is the Y direction, in other words, an X coordinate of the exposed portion 63C overlaps with the exposed portion 63E.

In the present embodiment, the exposed portion 63C is formed at the plate surface close to the back surface 21b similarly to the exposed portion 63E. In the main terminal 60C, a portion within the predetermined range from the projection portion is the exposed portion 63C, and the remaining portion close to the heat sink 40C is covered by the terminal covering portion 22. The exposed portion 63C is integrally formed not only over the facing portion 61C but also over the non-facing portions 62C at the both ends. The width of the exposed portion 63C substantially coincides the width of the main terminal 60C.

In the projection view from the Z direction, the exposed portion 63C straddles the facing portion 61E in the X direction. That is, the formation position of the exposed portion 63C in the X direction overlaps with the formation position of the exposed portion 63E in the X direction. In particular, in the present embodiment, in the X direction, the center position of the width of the exposed portion 63E substantially coincides with the center position of the width of the exposed portion 63C. Further, the center position of the width of the exposed portion 63E and the center position of the width of the exposed portion 63C are on a center line CL passing through the element center of the semiconductor element 30. The element center is a center of the semiconductor element 30 when the number of semiconductor elements 30 is one as in the present embodiment. For example, when the number of semiconductor elements 30 is two, the element center is the central position between the centers in the X direction of the two semiconductor elements 30. The center line CL is a virtual line orthogonal to the width direction and passing through the element center.

The terminal covering portion 22 covers a part of the main terminal 60 as described above. The sealing resin body 20 including the terminal covering portion 22 is interposed between, at least, the facing portions 61C and 61E. The sealing resin body 20 is placed in the entire of the facing area of the facing portions 61C and 61E. The facing portions 61 are lamination bodies of the facing portions 61C and 61E and the sealing resin body 20. In the main terminal 60, a portion on the projection tip side is covered by the terminal covering portion 22 and a root portion close to the heat sink 40 is covered by the main portion 21.

The exposed portions 63C and 63E are exposed from the terminal covering portion 22. The terminal covering portion 22 has one surface 22a and a back surface 22b opposite to the one surface 22a in the Z direction. The one surface 22a is a surface close to the heat dissipation surface 42E in the Z direction, and the back surface 22b is a surface close to the heat dissipation surface 42C. The back surface 22b of the terminal covering portion 22 has an opening portion, and the exposed portions 63C and 63E are connectable with the outside via this opening portion. The exposed portions 63C and 63E are substantially flush with the back surface 22b, and exposed.

The terminal covering portion 22 has a recess 23 in addition to the above opening portion. The recess 23 opens on the one surface 22a opposite to the back surface 22b where the exposed portion 63 opens, and is formed in the one surface 22a. The recess 23 is a clamp mark generated by the clamp of the mold when the sealing resin body 20 is molded. In the present embodiment, the recess 23 is formed so that a plate surface opposite to the surface where the exposed portion 63 is formed in the main terminal 60 forms a bottom. A portion of the plate surface forming the bottom is exposed to the outside via the recess 23. The recess 23 is a hole or a notch.

Figure 2:
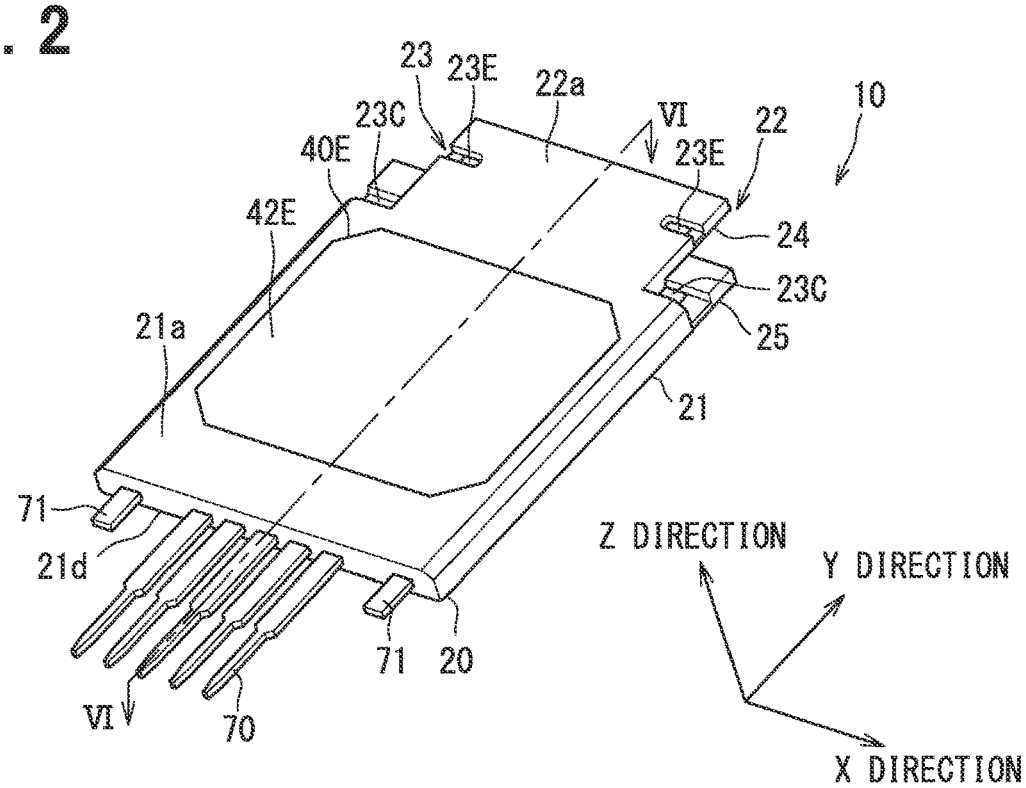
FIG. 2 is a perspective view showing a semiconductor module.
Figure 3:
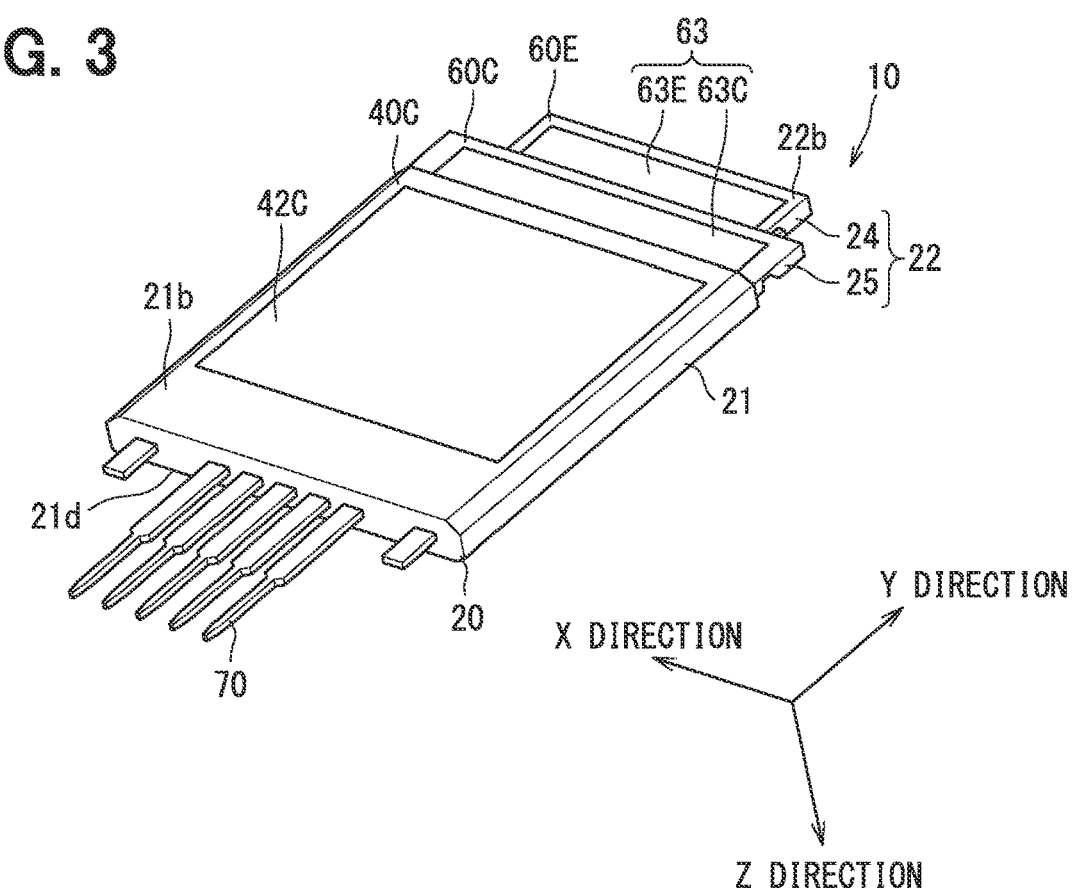
FIG. 3 is a perspective view showing the semiconductor module.
Figure 5:
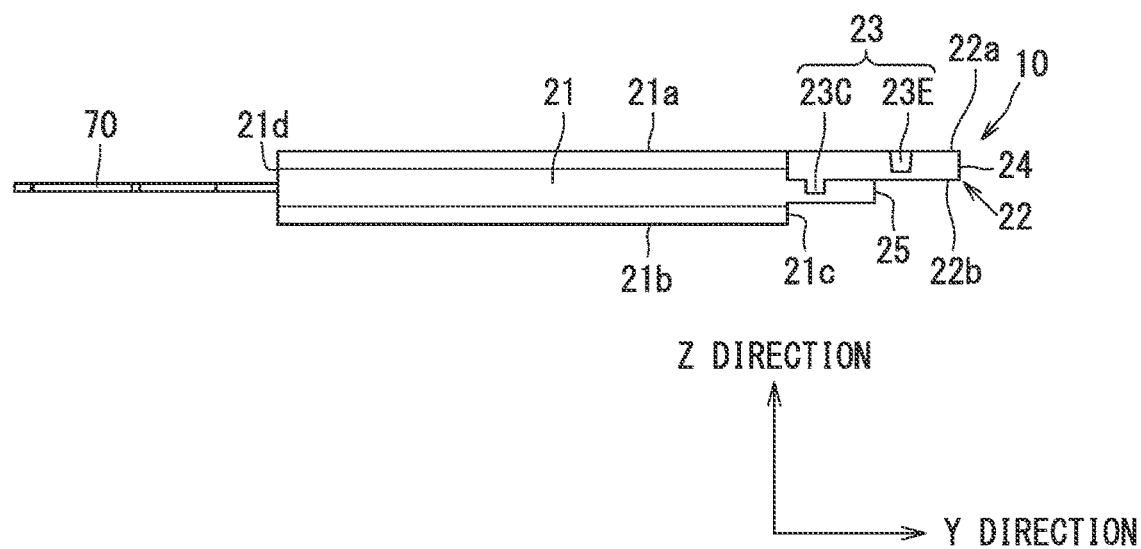
FIG. 5 is a side surface view of the semiconductor module.
Figure 6:
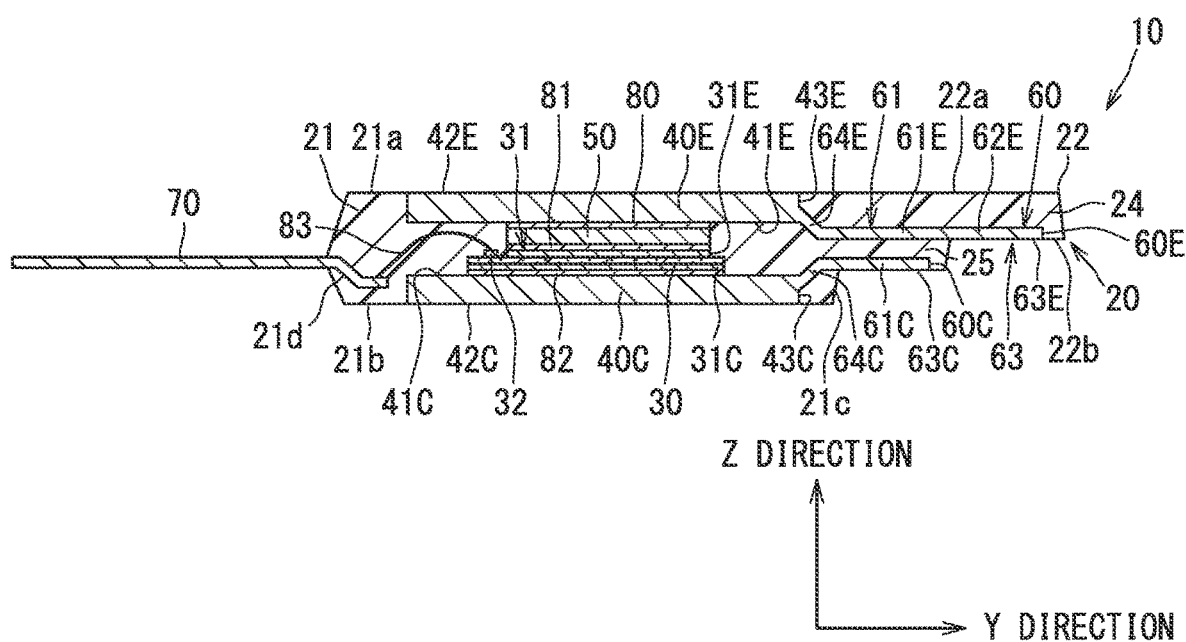
FIG. 6 is a cross-sectional view of the semiconductor device taken along a line VI-VI in FIG. 2.

As shown in FIG. 2 and FIG. 5, the terminal covering portion 22 has, as the recess 23, a recess 23E placed on the non-facing portion 62E of the main terminal 60E and a recess 23C placed on the non-facing portion 62C of the main terminal 60C. The recess 23E corresponds to a first recess, and the recess 23C corresponds to a second recess. The recess 23E is formed so that the recess 23E opens on one surface 22a and the non-facing portion 62E forms the bottom. The recess 23E is placed near each of the both ends of the non-facing portion 62E in the X direction that is the width direction. The recess 23E is provided as a notch, and opens on the side surface of the terminal covering portion 22.

The recess 23C is formed so that the recess 23C opens on the one surface 22a and the non-facing portion 62C forms the bottom. The recess 23C is placed at each non-facing portion 62E in the X direction that is the width direction. The recess 23C is placed near each of the both ends of the main terminal 60C in the X direction. The recess 23C is provided as a notch, and opens on the side surface of the terminal covering portion 22.

The terminal covering portion 22 has a step in the Z direction. The terminal covering portion 22 has a first holding portion 24 for holding the main terminal 60E and a second holding portion 25 for holding the main terminal 60C. The first holding portion 24 is continuous from the side surface 21c of the main portion 21. The first holding portion 24 extends from the side surface 21c in the Y direction. The first holding portion 24 extends farther than the second holding portion 25 with respect to the semiconductor element 30. The first holding portion 24 extends with a substantially constant width. The thickness of the first holding portion 24 is made substantially constant. The first holding portion 24 has a substantially rectangular plane shape. The width of the first holding portion 24 is wider than the width of the main terminal 60E, and narrower than the width of the main terminal 60C. A part of each non-facing portion 62C is located outside the first holding portion 24 in the X direction. The first holding portion 24 covers the plate surface and the side surface opposite to that of the exposed portion 63E of the main terminal 60E.

In the first holding portion 24, the one surface 22a is substantially flush with the one surface 21a of the main portion 21. In the first holding portion 24, the back surface 22b is located at a position closer to the one surface 21a than the back surface 21b of the main portion 21 in the Z direction. The back surface 22b of the first holding portion 24 is substantially flush with the plate surface close to the exposed portion 63E of the main terminal 60E. The exposed portion 63E is substantially flush with the back surface 22b of the first holding portion 24, and is exposed.

The second holding portion 25 is also continuous from the side surface 21c of the main portion 21. The second holding portion 25 is placed on the first holding portion 24 on the side of the back surface 21b. The second holding portion 25 extends from the side surface 21c in the Y direction. The second holding portion 25 extends with the substantially constant width. The thickness of the second holding portion 25 is made substantially constant. The second holding portion 25 has a substantially rectangular plane shape. The extension length of the second holding portion 25 is shorter than the extension length of the first holding portion 24. The projection tip position of the second holding portion 25 coincides with the end of the exposed portion 63E on the side of the heat sink 40E. The second holding portion 25 covers a part of the plate surface close to the exposed portion 63E among the plate surfaces of the main terminal 60E.

The width of the second holding portion 25 is wider than the widths of the first holding portion 24 and the main terminal 60C. The second holding portion 25 covers the plate surface of the main terminal 60C on the opposite side to the exposed portion 63C and the side surface of the main terminal 60C. In the second holding portion 25, the one surface 22a is substantially flush with the back surface 22b of the first holding portion 24. In the second holding portion 25, the back surface 22b is placed between the back surface 21b of the main portion 21 and the back surface 22b of the first holding portion 24 in the Z direction. The back surface 22b of the second holding portion 25 is substantially flush with the plate surface close to the exposed portion 63C among the plate surfaces of the main terminal 60C. The exposed portion 63C is substantially flush with the back surface 22b of the second holding portion 25 and is exposed. The exposed portion 63C is placed at a position different from the exposed portion 63E in the Z direction.

Figure 8:
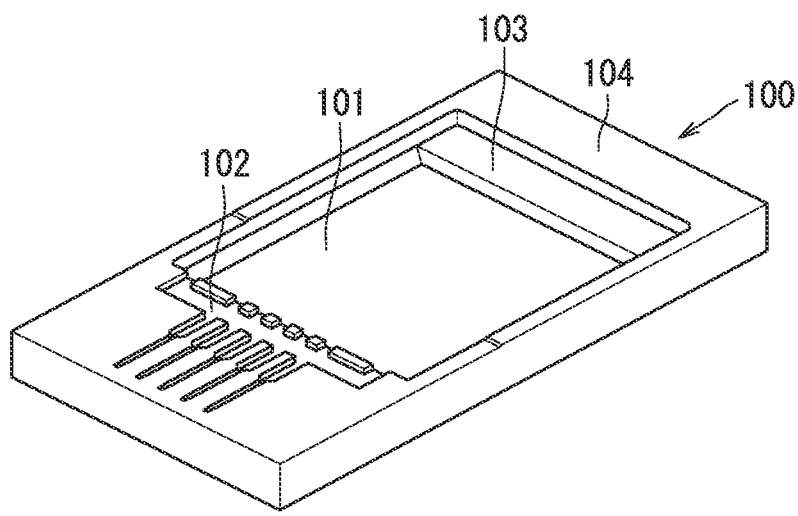
FIG. 8 is a perspective view showing a mold for molding a sealing resin body.
Figure 8:
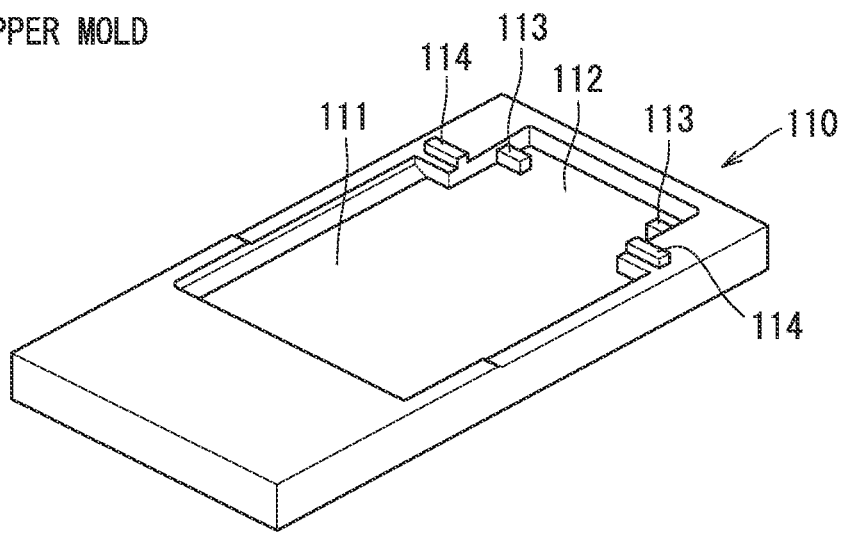

FIG. 8 is one example of a mold for molding the sealing resin body 20. A part (a) of FIG. 8 shows a lower mold 100 close to the heat sink 40C, and a part (b) of FIG. 8 shows an upper mold 110 close to the heat sink 40E. By using the lower mold 100 and the upper mold 110, the sealing resin body 20 including the terminal covering portion 22 is formed.

The lower mold 100 includes a recess 101 and support portions 102 to 104. The heat sink 40C is placed on the recess 101. The heat dissipation surface 42C of the heat sink 40C may contact with a bottom surface of a recess 111, and may be separated from the bottom surface. When the heat dissipation surface 42C is separated, the heat dissipation surface 42C may be exposed by, for example, cutting after molding. The support portion 102 supports a signal terminal 70, a part of the suspension lead 71, and a tie bar (not shown).

The support portion 103 projects from the bottom surface of the recess 101. The support portion 103 is a portion whose bottom surface is high due to a step in the recess 101. A position of the support portion 103 is lower than a position of the peripheral portion of the recess 101. The support portion 103 is provided corresponding to the second holding portion 25 of the terminal covering portion 22. The exposed portion 63C of the main terminal 60C is placed to contact with the support portion 103. A width of the support portion 103 is wider than that of the exposed portion 63C (main terminal 60C). A support portion 104 is a portion around the recess 101, and adjacent to the support portion 103 in the extending direction. The exposed portion 63E of the main terminal 60E is placed to contact with the support portion 104.

The upper mold 110 include recesses 111 and 112 and convex portions 113 and 114. The heat sink 40E is placed on the recess 111. The heat dissipation surface 42E of the heat sink 40E may contact with a bottom surface of the recess 111, and may be separated from the bottom surface. When the heat dissipation surface 42E is separated, the heat dissipation surface 42E may be exposed by, for example, cutting after molding. The recess 112 is continuous from the recess 111. The recess 112 is provided corresponding to the first holding portion 24 of the terminal covering portion 22. A depth of the recess 112 is substantially same as a depth of the recess 111. A bottom surface of the recess 112 may be substantially flush with a bottom surface of the recess 111. A width of the recess 112 is narrower than a width of the recess 111.

The convex 113 projects from the bottom surface of the recess 112. The convex 113 is placed corresponding to the recess 23E of the terminal covering portion 22. The upper mold 110 includes two convex portions 113. The convex portions 113 are portions that press the non-facing portion 62E of the main terminal 60E from the plate surface side opposite to the exposed portion 63E. In a mold clamping state, the convex portions 113 are placed at positions overlapping with the support portion 104 in the projection view from the Z direction. At the time of molding, the main terminal 60E is clamped from the both sides in the plate thickness direction by the support portion 104 and the convex 113.

The convex 114 projects from a portion around the recesses 111 and 112. The convex 114 is placed at each of the both ends of the recess 112 in the width direction. The upper mold 110 includes two convex portions 114. The convex portions 114 are portions that press the non-facing portion 62C of the main terminal 60C from the plate surface side opposite to the exposed portion 63C. In the mold clamping state, the convex portions 114 are placed at positions overlapping with the vicinity of the both ends of the support portion 103 in the projection view from the Z direction. At the time of molding, the main terminal 60C is clamped from the both sides in the plate thickness direction by the support portion 103 and the convex 114.

In order to press (clamp) the main terminal 60 at the time of molding, a movable pin may be used instead of the fixed convex portions 113 and 114.

Overview of First Embodiment

In the present embodiment, the main terminal 60 has the facing portion 61. At the facing portion 61, the plate surfaces of the main terminals 60C and 60E are separated from each other, and face each other. Since the separated placement, that is, the placement having the predetermined gap is provided, it is possible to secure the insulation between the main terminals 60C and 60E. Since the plate surfaces face each other, the effect of canceling the magnetic flux generated when the main current flows is high. Thereby, it is possible to reduce the inductance.

Figure 9:
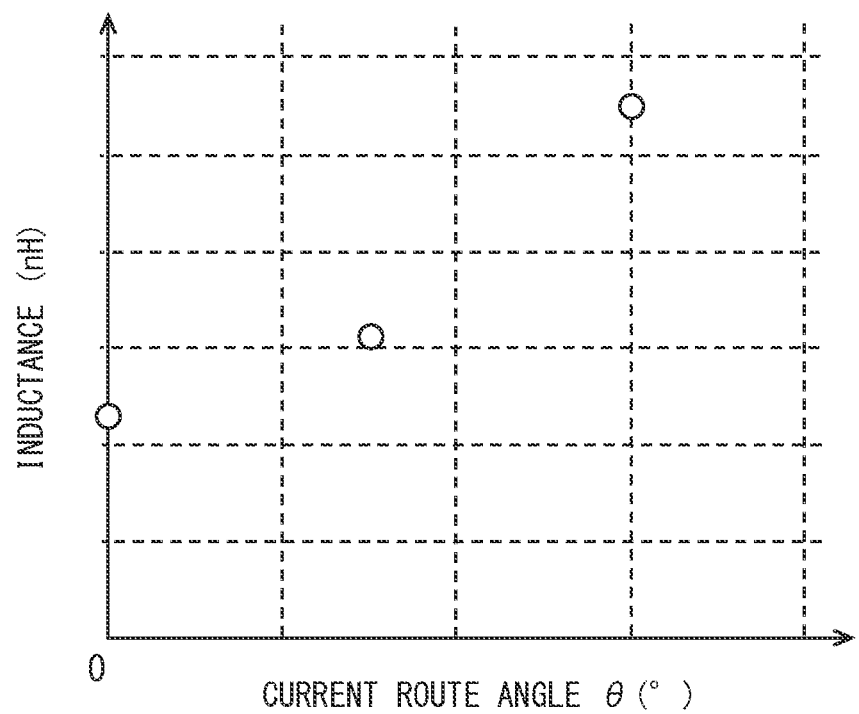
FIG. 9 is a diagram showing a relationship between a current path angle θ and an inductance.

FIG. 9 shows a magnetic field analysis result of the inductance of the one arm constituting the upper-lower arm circuit 6, specifically, the inductance between the main terminals 60C and 60E. FIG. 9 is the magnetic field analysis result when the main terminals 60C and 60E are placed to face each other. In this magnetic field analysis, three levels of the current path angles θ were provided. The current path angle θ is an angle of the current path formed between the exposed portion 63C, the semiconductor element 30, and the exposed portion 63E in the plan view from the Z direction.

A shown in FIG. 9, it was clarified that, as the current path angle θ is smaller, the inductance can be more reduced. It was clarified that, although the inductance can be reduced by the facing placement, the reduction effect weakens as the current path angle θ increases.

In the present embodiment, the main terminal 60E has the non-facing portion 62E continuous from the facing portion 61E on the side opposite to the heat sink 40E. That is, the main terminal 60E extends farther than the main terminal 60C. In the non-facing portion 62E the exposed portion 63E that is the connection portion with the outside. The exposed portion 63C of the main terminal 60C is formed in the facing portion 61C. Since the positions of the exposed portions 63C and 63E are shifted in the extending direction of the main terminal 60, the formation positions in the with direction of the exposed portions 63C and 63E can be overlapped while the facing portion 61 is secured. Due to the overlap of the exposed portions 63C and 63E, the above current path angle θ can be reduced as compared with the configuration in which the exposed portions 63C and 63E do not overlap.

As described above, according to the semiconductor module 10 of the present embodiment, it is possible to reduce the inductance.

Figure 10:
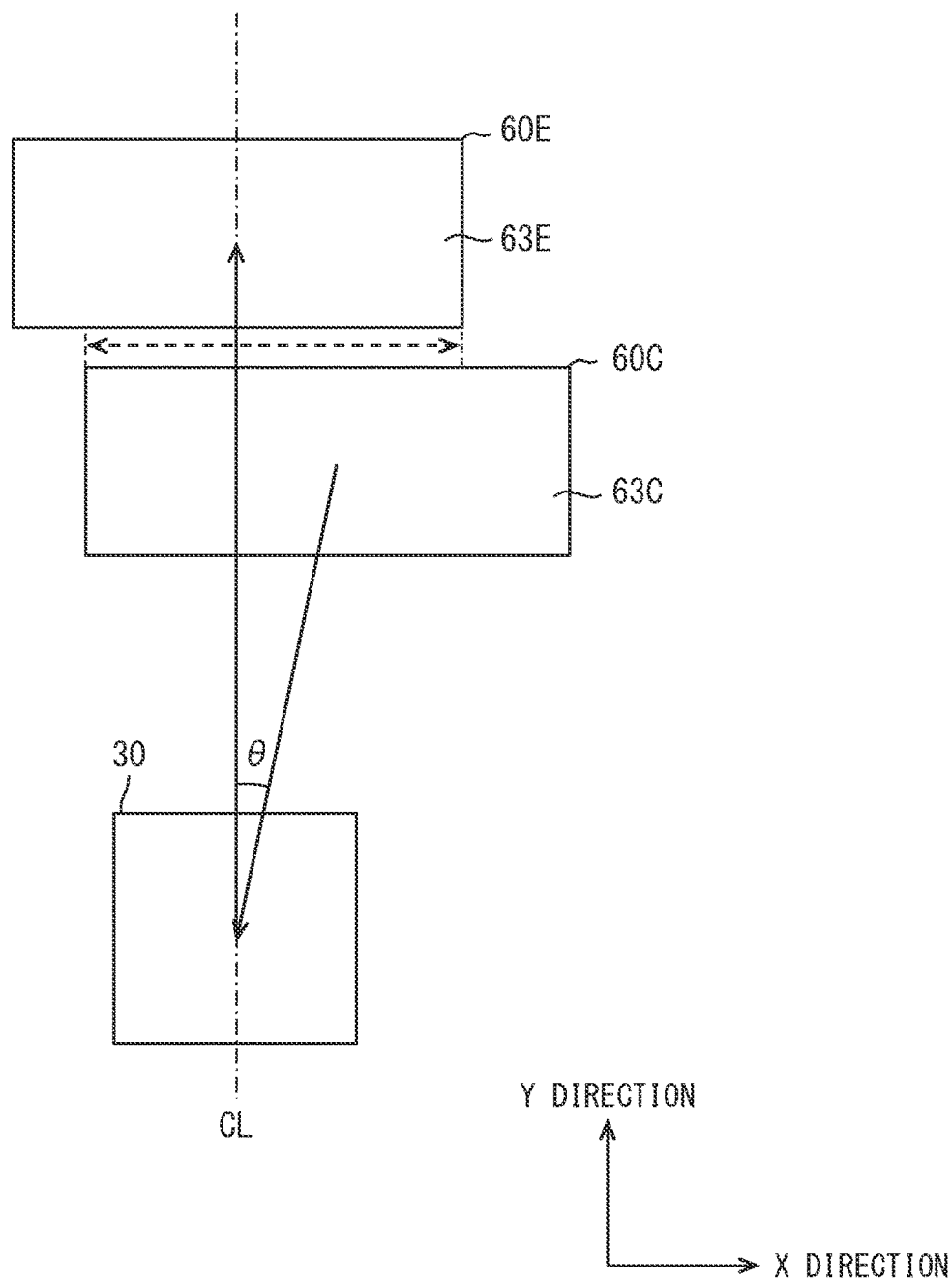
FIG. 10 is a plan view showing a modification.

As in a modification shown in FIG. 10, the exposed portions 63C and 63E may be shifted in the X direction that is the width direction. FIG. 10 is obtained by further simplifying FIG. 7, and shows only the exposed portions 63C and 63E and the semiconductor element 30. A broken line arrow shown in FIG. 10 is an area where the exposed portions 63C and 63E overlap in the width direction. Due to the overlap, it is possible to reduce the current path angle θ. In FIG. 10, in the width direction, the center position of the exposed portion 63E and the center position of the exposed portion 63C are deviated from each other. Further, in one example, the center position of the exposed portion 63C is a position deviating from the center line CL.

On the other hand, in the present embodiment, in the width direction, the center position of the exposed portion 63E substantially coincides with the center position of the exposed portion 63C. Thereby, as compared with the configuration in which the center positions are deviated, it is possible to reduce the current path angle θ. Accordingly, it is possible to effectively reduce the inductance.

In particular, in the present embodiment, the center position of the width of the exposed portion 63E and the center position of the width of the exposed portion 63C are on the a center line CL passing through the element center of the semiconductor element 30. Thereby, the current path angle θ is ideally approximately 0 (°). Accordingly, it may be possible to effectively reduce the inductance.

Figure 11:
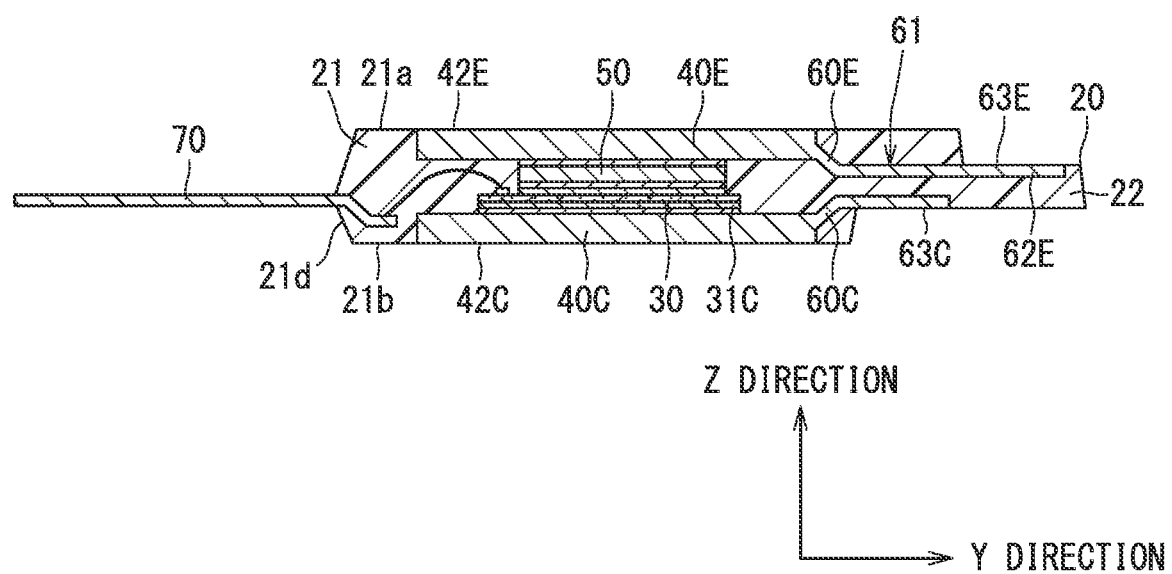
FIG. 11 is a cross-sectional view showing a modification.

As in a modification shown in FIG. 11, the exposed portions 63C and 63E may be placed at the plate surfaces on different sides of the main terminals 60C and 60E. The exposed portion 63C is formed at a plate surface opposite to a surface facing the main terminal 60E among plate surfaces of the main terminal 60C corresponding to the second main terminal. In FIG. 11, also the exposed portion 63E is formed at the plate surface opposite to the plate surface facing the main terminal 60C. The exposed portion 63E is formed at the plate surface close to the heat dissipation surface 42E among the plate surfaces of the non-facing portion 62E. Even when the exposed portion 63C and 63E are placed at different plate surfaces, it is possible to reduce the inductance due to the overlapping of the formation positions of the exposed portions 63C and 63E.

On the other hand, in the present embodiment, the exposed portions 63C and 63E are formed at the same side plate surfaces of the main terminal 60C and 60E, specifically, the place surfaces close to the heat dissipation surface 42C. For example, for each of the exposed portions 63C and 63E, for example, a bus bar can be connected from the same side in the Z direction. Therefore, the connectivity between the main terminals 60 and the outside can be improved. Further, in the configuration including the sealing resin body 20, it is possible to simplify the structure for molding the sealing resin body 20.

Although not shown, for example, the terminal covering portion 22 may not be placed, and air (gas) may be interposed between facing surfaces of the main terminals 60C and 60E in the facing portion 61. In this case, for the insulation between the main terminals 60C and 60E, the predetermined gap (space distance) is secured between the facing surfaces. It can be applied depending on the used voltage range.

On the other hand, in the present embodiment, the semiconductor module 10 includes the sealing resin body 20. The sealing resin body 20 is interposed between the main terminals 60C and 60E constituting the facing portion 61. As described above, by providing not the space insulation but the interlayer insulation obtained by filling the resin between the facing surfaces, it is possible to bring the facing surfaces of the main terminals 60C and 60E closer due to the insulation ability of the resin. Accordingly, it may be possible to further reduce the inductance.

Figure 12:
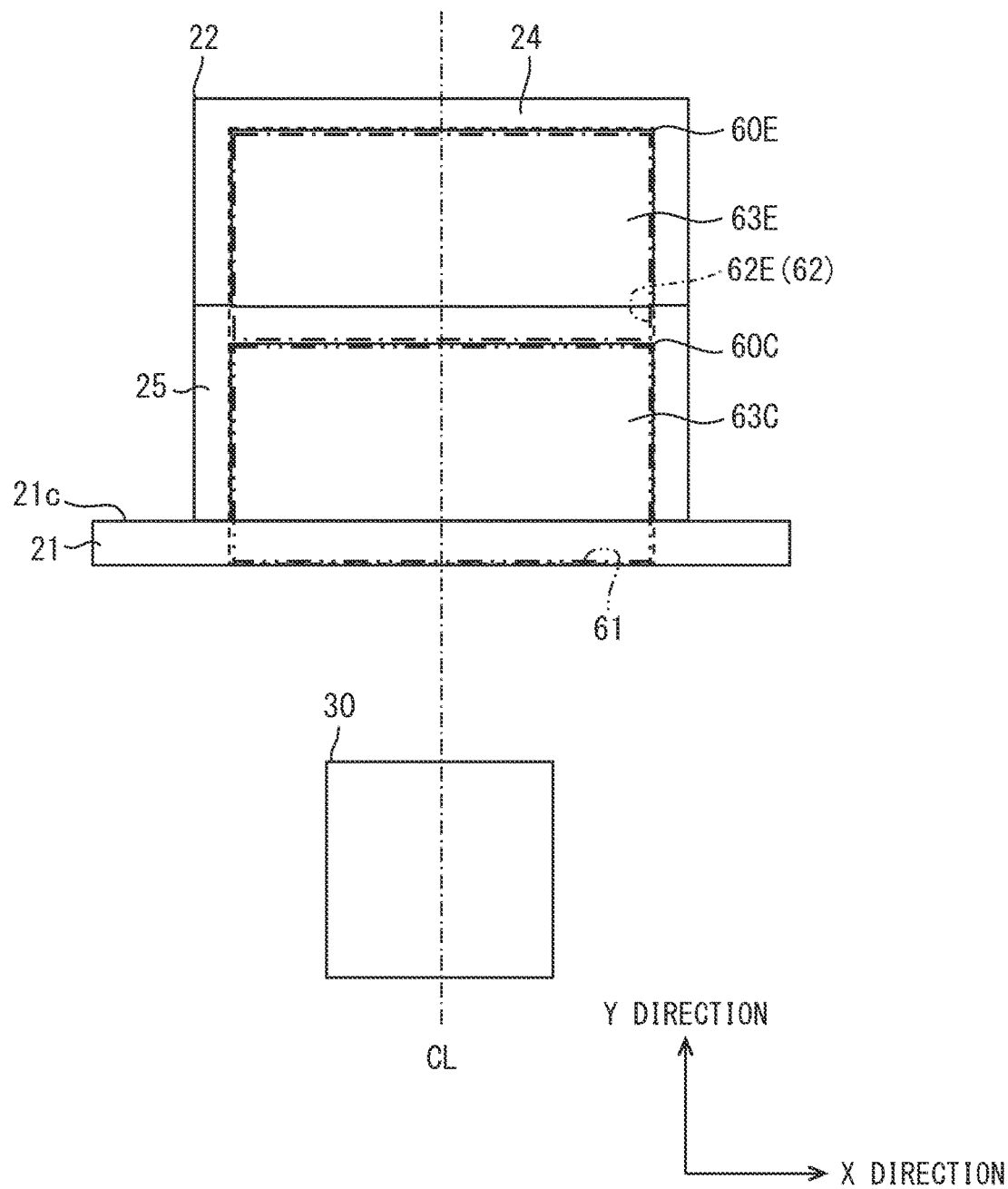
FIG. 12 is a plan view showing a modification.

As in a modification shown in FIG. 12, the main terminal 60C that is the second main terminal may not include the non-facing portion 62C. In FIG. 12, the width of the main terminal 60C is substantially same as the width of the main terminal 60E. The width of the exposed portion 63C is substantially same as the width of the exposed portion 63E. In the width direction, the formation positions of the exposed portions 63C and 63E are substantially same. Since the current path angle θ is reduced, it is possible to reduce the inductance. When the sealing resin body 20 including the terminal covering portion 22 is molded, a through hole may be provided in the facing portion 61E of the main terminal 60E for clamping the main terminal 60C from both surface sides.

On the other hand, in the present embodiment, the main terminal 60C has the non-facing portion 62C connected to both sides of the facing portion 61C in the width direction so as to sandwich the facing portion 61C. At the time of molding, the plate surface opposite to the formation surface of the exposed portion 63C can be pressed by the non-facing portion 62. Accordingly, not only the main terminal 60E but also the main terminal 60C can be clamped from the both surface sides. Thereby, it is possible to prevent the resin leakage and the like. That is, it is possible to improve the moldability of the sealing resin body 20.

In the present embodiment, the terminal covering portion 22 has the recesses 23C and 23E that open on the side of one surface 22a as the traces of pressing the plate surface opposite to the formation surface of the exposed portion 63 at the molding. Instead of this, at least one recess 23 (23C, 23E) may be secondarily sealed. Further, the example in which the recess 23 is formed so that the plate surface of the main terminal 60 is the bottom has been shown. However, it is not limited to this. The bottom of the recess 23 may be the resin, and the plate surface may not be exposed. For example, after the movable pin is pulled out, the resin before it is completely cured flows, and the contact portion with the pin at the plate surface is covered. Thereby, the recess 23 is provided, and the plate surface is not exposed.

Figure 13:
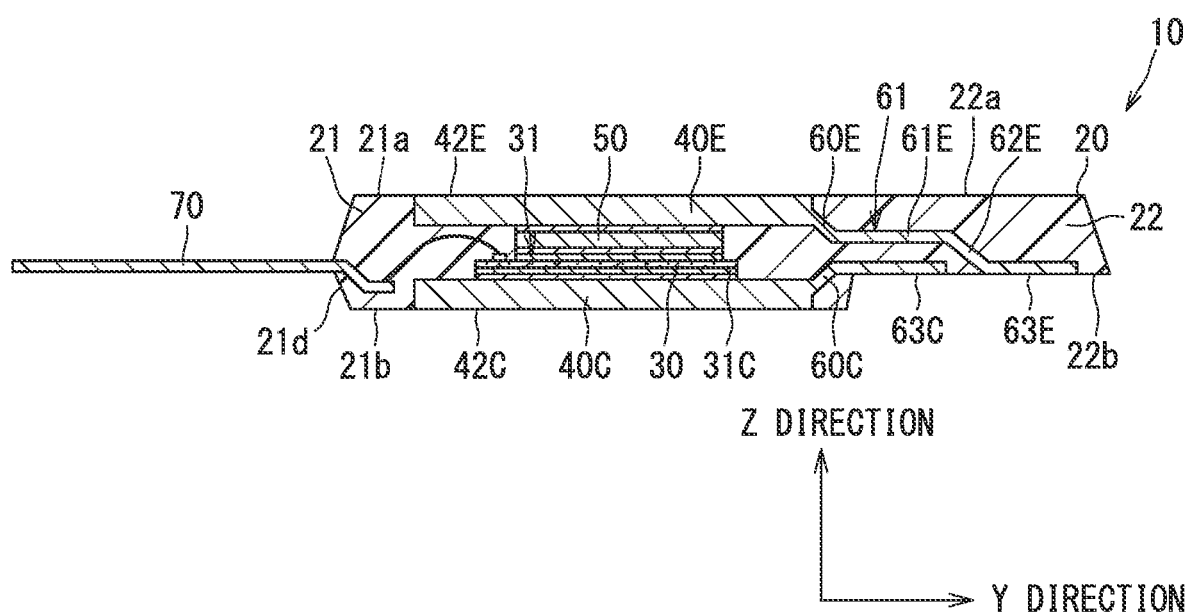
FIG. 13 is a cross-sectional view showing a modification.

In the present embodiment, the example in which the positions of the exposed portions 63C and 63E are different in the Z direction has been shown. However, it is not limited to this. For example, as in a modification shown in FIG. 13, the exposed portions 63C and 63E may be substantially flush. In FIG. 13, the non-facing portion 62E has a bent portion between the exposed portion 63E and the facing portion 61E. Due to this bent portion, the position of the exposed portion 63E in the Z direction and the position of the exposed portion 63C in the Z direction are substantially same.

In the present embodiment, the example in which the main terminal 60E extends farther than the main terminal 60C has been shown. However, it is not limited to this. Although not shown, the reversed configuration may be employed. In this case, the main terminal 60C extends farther than the main terminal 60E. The main terminal 60C has the non-facing portion 62C continuous from the facing portion 61C on the opposite side to the heat sink 40C. The exposed portion 63C is formed at the non-facing portion 62C. The main terminal 60E has the non-facing portion 62E continuous from the facing portion 61E at both sides in the width direction. The exposed portion 63E is formed at the plate surface opposite to the surface facing the main terminal 60C in at least the facing portion 61E so that the formation position in the width direction overlaps with the exposed portion 63C.

In this configuration, the collector electrode 31c corresponds to a first main electrode, and the emitter electrode 31E corresponds to a second main electrode. The heat sink 40C corresponds to a first conductive member, and the heat sink 40E corresponds to a second conductive member. The main terminal 60C corresponds to a first terminal, and the main terminal 60E corresponds to a second terminal. The non-facing portion 62C corresponds to a non-facing portion of the first main terminal and a first non-facing portion, and the non-facing portion 62E corresponds to a second non-facing portion. The exposed portion 63C corresponds to a first connection portion, and the exposed portion 63E corresponds to a second connection portion.

The example in which solders 80, 81, and 82 are used has been shown. However, the joint member is not limited to the solders. For example, Ag paste may be used.

Second Embodiment

This embodiment is a modification of a basic aspect of the preceding embodiment. In the above embodiment, the second main terminal extends with the substantially constant width. Instead of this, a notch may be provided at the second non-facing portion.

Figure 14:
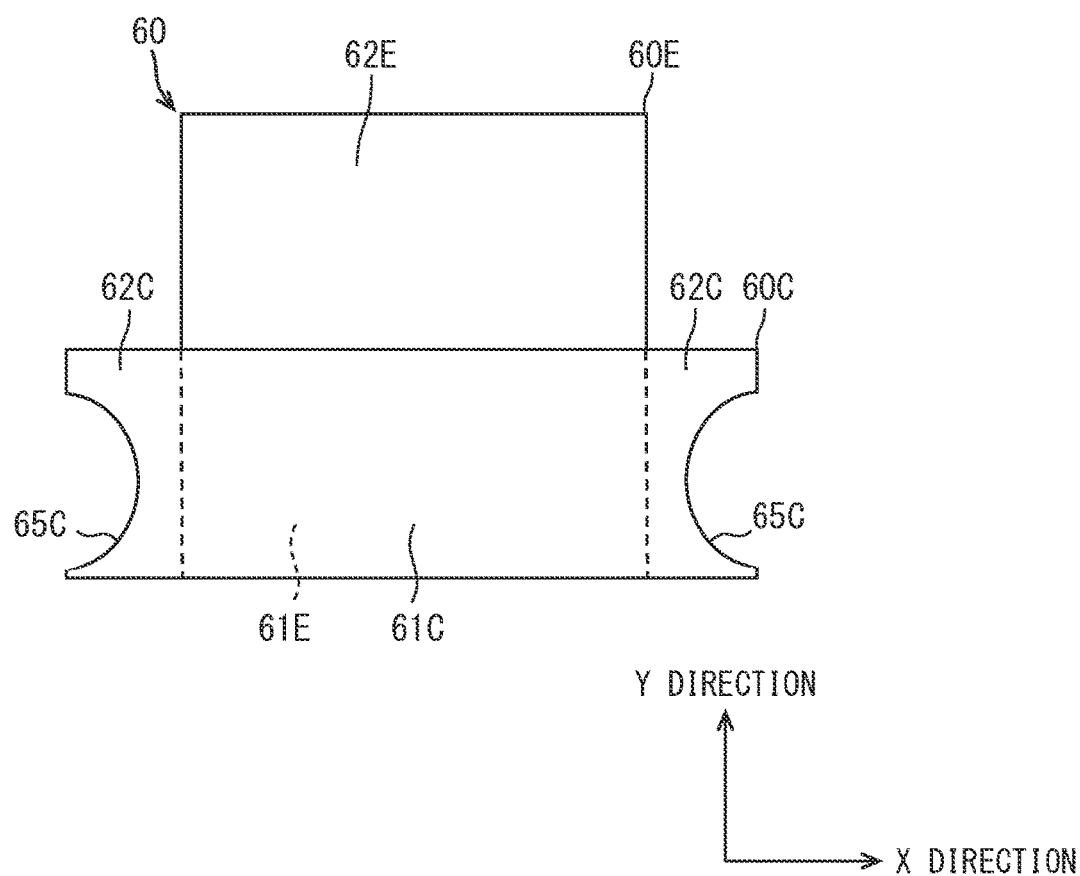
FIG. 14 is a plan view showing a shape of the main terminal and a positional relationship in a semiconductor module according to a second embodiment.

FIG. 14 shows the main terminal 60 in the semiconductor module 10 of the present embodiment. Similarly to the preceding embodiment, the main terminal 60E has the non-facing portion 62E continuous from the facing portion 61E on the side opposite to the heat sink 40E. The main terminal 60C has the non-facing portion 62C continuous from each of the both ends of the facing portion 61C in the width direction. That is, the main terminal 60E corresponds to a first main terminal, and the main terminal 60C corresponds to a second main terminal.

In the non-facing portion 62C corresponding to the second non-facing portion, a notch 65C is formed. In FIG. 14, the notch 65C is formed in each non-facing portion 62C. The notches 65C are formed at the ends of the main terminal 60C inn the width direction. The notch 65C is formed at a position close to the semiconductor element 30 in the Y direction. The notch 65C has a substantially arcuate plane shape.

Overview of Second Embodiment

The current flowing during the switching, that is, the AC current is concentrated on the surface of the main terminal 60, for example, the surface in the width direction due to the effect of the surface effect. As the frequency increase, the current is concentrated on the surface. In the configuration where the non-facing portions 62C are provided at ends in the width direction, the current is concentrated on the non-facing portions 62C. Therefore, there is a possibility that the effect of canceling the magnetic flux is weakened.

On the other hand, in the present embodiment, the notch 65C is placed in the non-facing portion 62C. Thereby, at a portion where the notch 65C is formed, the end of the main terminal 60C approaches the main terminal 60E (facing portion 61E). Thereby, as compared with the configuration having no notch 65C, it is possible to reduce the influence of the surface effect. That is, it is possible to enhance the magnetic flux canceling effect.

In particular, in the present embodiment, the notch 65C is formed so as to be close to the semiconductor element 30. Thereby, in the current path of the semiconductor element 30, it is possible to further reduce the influence of the surface effect.

In the present embodiment, the example in which the notches 65C are formed at both ends in the width direction has been shown. However, it is not limited to this. The notch 65C may be formed in only one of the non-facing portions 62C.

The shape of the notch 65C is not limited to the above example. The example in which the notch is formed in the main terminal 60C has been shown. However, it is not limited to this. In the configuration in which the main terminal 60E is the second main terminal, the notch is formed in the main terminal 60E.

Third Embodiment

This embodiment is a modification of a basic aspect of the preceding embodiments. In the above embodiments, the semiconductor module 10 has no connection target of the main terminal 60. Instead of this, the semiconductor module 10 may have the bus bar that is the connection target.

Figure 15:
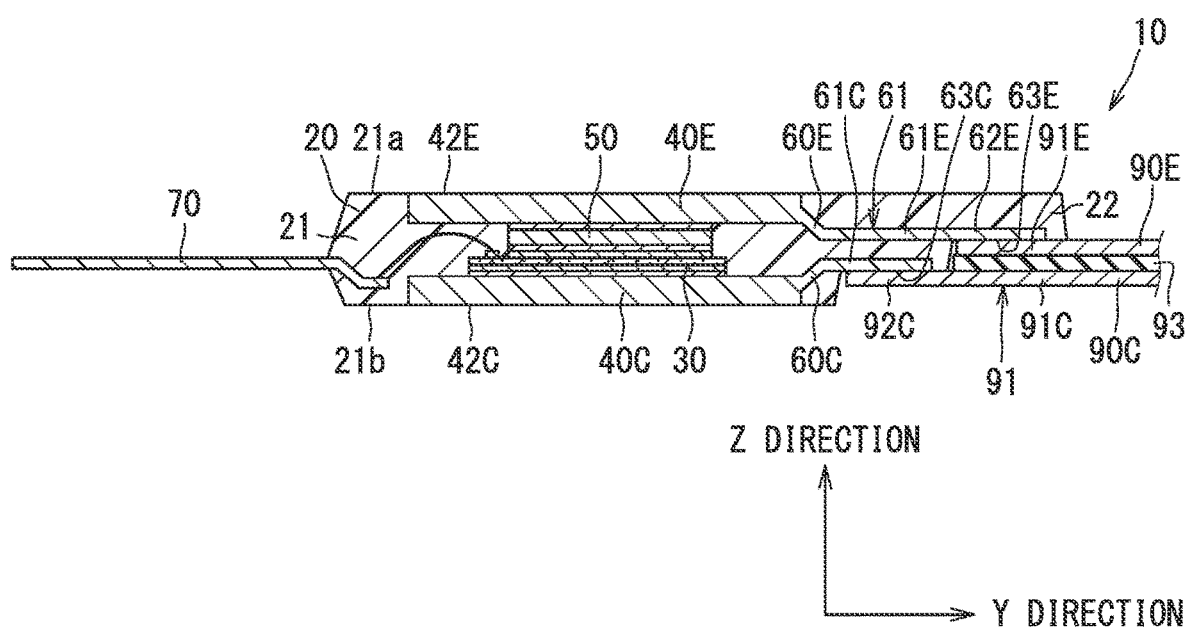
FIG. 15 is a cross-sectional view showing a semiconductor module according to a third embodiment and corresponding to FIG. 6.
Figure 16:
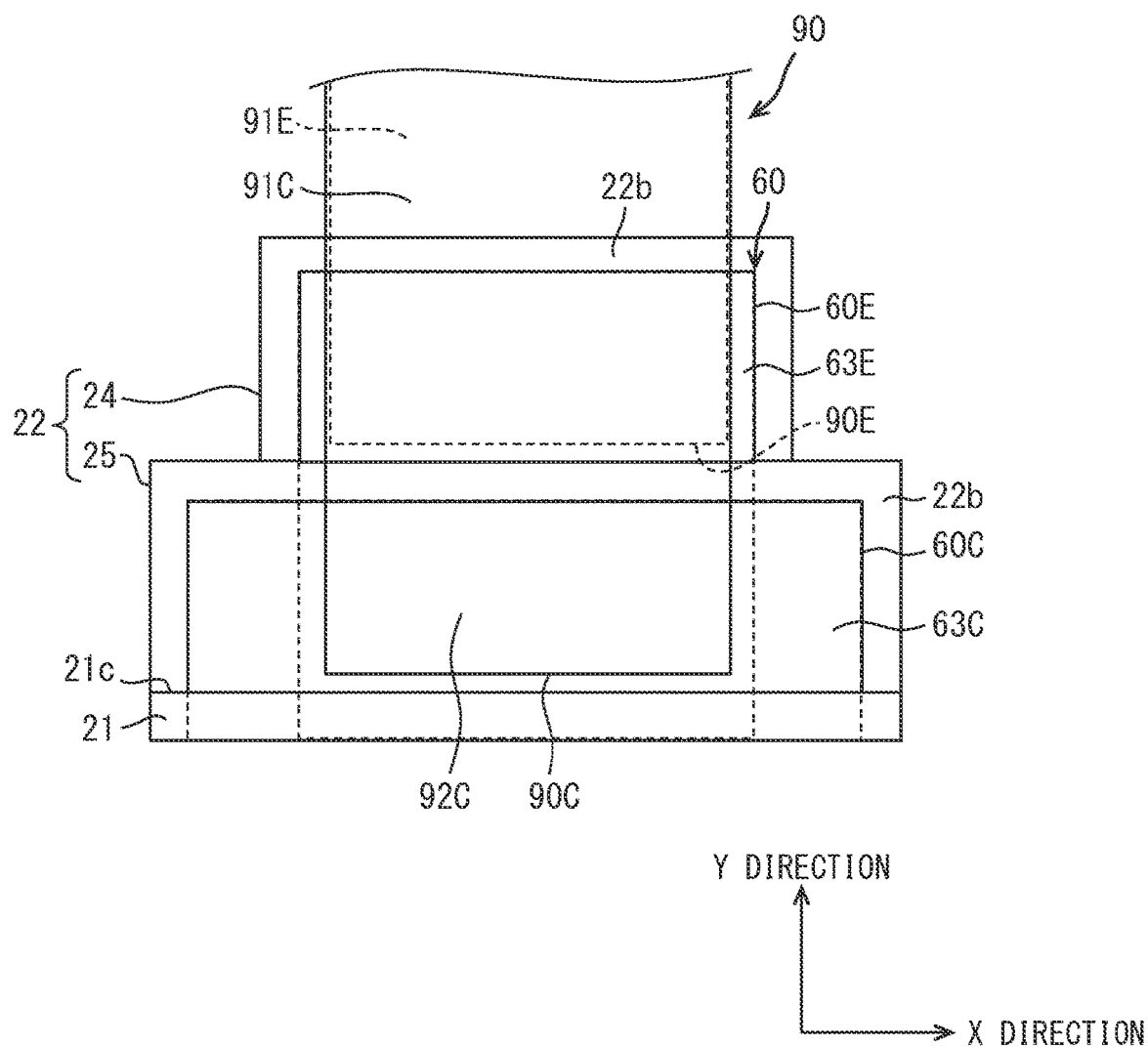
FIG. 16 is a plan view showing a periphery of a connection portion of a bus bar with the main terminal.

As shown in FIGS. 15 and 16, the semiconductor module 10 of the present embodiment further includes a bus bar 90. The semiconductor module 10 includes, as the bus bar 90, a bus bar 90E connected to the main terminal 60E and a bus bar 90C connected to the main terminal 60C. In the semiconductor module 10, a portion excluding the bus bar 90 may be referred to as the semiconductor device. The bus bar 90E corresponds to a first bus bar, and the bus bar 90C corresponds to a second bus bar. For the connection between the bus bar 90 and the corresponding main terminal 60, welding, bonding using the connection member such as solder, ultrasonic bonding, friction stir welding, or the like can be used.

The bus bar 90 has a facing portion 91 and a non-facing portion 92C. The facing portion 91 is a facing portion where the bus bar 90C and the bus bar 90C are separated. The plate surfaces of the bus bars 90C and 90E face each other. Hereinafter, in the bus bars 90C and 90E, portions constituting the facing portion 91 may be also referred to as facing portions 91C and 91E. The facing portions 91C and 91E are placed so that magnetic fluxes generated when a main current flows are cancelled each other. The non-facing portion 92C is continuous from the facing portion 91C of the bus bar 90C. The non-facing portion 92C is connected to the exposed portion 63C of the main terminal 60C.

In the present embodiment, each bus bar 90 extends in the Y direction within the predetermined range from the end close to the main terminal 60. The plate thickness of the bus bar 90 is substantially parallel to the Z direction. The bus bar 90 extends to the outside of the semiconductor device along the Y direction in the projection view from the Z direction. Between the facing portions 91C and 91E, an insulation member 93 is interposed for the electrical insulation between the bus bars 90C and 90E. As the insulation member 93, an insulation paper or a resin sheet such as PEEK can be used. At the facing portion 91, the bus bar 90E, the insulation member 93, and the bus bar 90C are laminated in this order. As show in FIG. 15, the bus bar 90E is placed on the insulation member 93, and the insulation member 93 is placed on the bus bar 90C.

The bus bar 90E has the facing portion 91. The end close to the main terminal 60E among ends of the bus bar 90E is referred to as a facing portion 91E. In the projection view from the Z direction, the end of the facing portion 91E overlaps with the exposed portion 63E of the main terminal 60E. The plate surfaces of the main terminal 60E and the bus bar 90E face each other. At the facing portion 91E, the bus bar 90E is connected to the exposed portion 63E. The facing portion 91E extends from the connection portion with the exposed portion 63E in a direction that is the Y direction and away from the semiconductor element 30. As described above, the bus bar 90E does not have a non-facing portion connected to the exposed portion 63E.

The bus bar 90C has, as described above, the facing portion 91C and the non-facing portion 92C. In the projection view from the Z direction, the facing portion 91C faces the bus bar 90E. The facing portion 91C overlaps with the exposed portion 63E in the projection view from the Z direction. Similarly to the facing portion 91E, the facing portion 91C extends from the portion overlapping with the exposed portion 63E in the direction that is the Y direction and away from the semiconductor element 30.

The non-facing portion 62C is a portion that does not face the bus bar 90E in the Z direction. The end close to the main terminal 60C in ends of the bus bar 90C is referred to as the non-facing portion 62C. The non-facing portion 62C is continuous from the end close to the main terminal 60C in the facing portion 91C in the Y direction. The non-facing portion 92C overlaps with the exposed portion 63C of the main terminal 60C. The plate surfaces of the main terminal 60C and the bus bar 90C face each other. At the non-facing portion 92C, the bus bar 90C is connected to the exposed portion 63C. The bus bar 90C extends from the connection portion with the exposed portion 63C in a direction that is the Y direction and away from the semiconductor element 30. The bus bar 90C overlaps with the non-facing portion 62C of the main terminal 60E in the projection view form the Z direction.

Overview of Third Embodiment

In the present embodiment, the bus bar 90 has the facing portion 91 and the non-facing portion 92C. Accordingly, the bus bar 90 can be connected without impairing the effect of the main terminal 60 having the structure shown in the preceding embodiment. Further, by providing the facing portion 91, it is possible to cancel the magnetic fluxes generated when the main current flows through the bus bars 90C and 90E. Thereby, the inductance of the main circuit wiring including the bus bar 90.

Although not shown, in the bus bar 90, the pulled direction from the exposed portion 63 of the main terminal 60 is not particularly limited. For example, it may be pulled out in the X direction from the connection portion with the exposed portion 63E.

Figure 17:
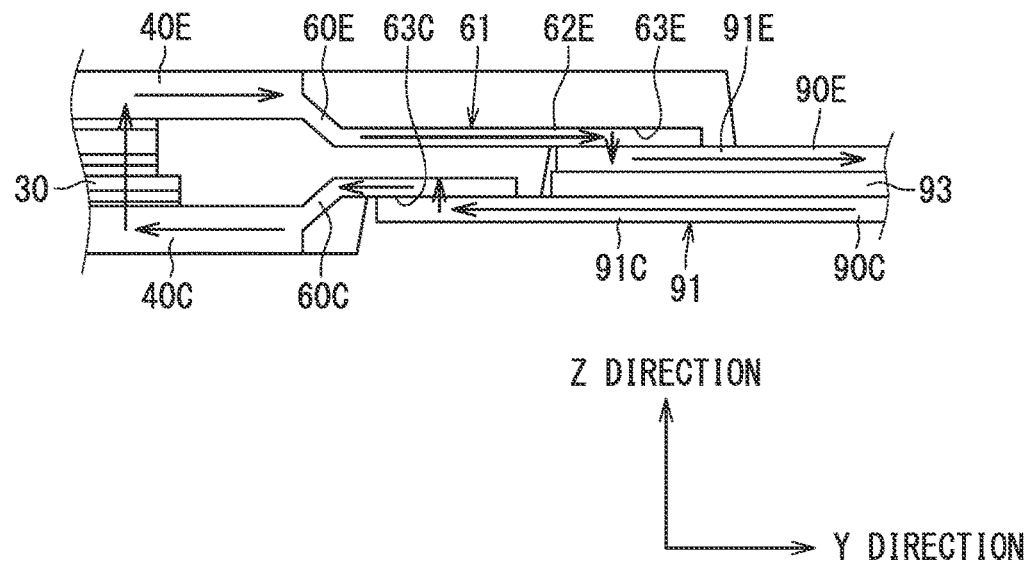
FIG. 17 is a schematic diagram showing a current path.

On the other hand, in the present embodiment, in the bus bar 90C, the non-facing portion 92C extends along the Y direction, and at least a part of the facing portion 91 extends along the Y direction from an end close to the non-facing portion 92C. In the projection view from the Z direction, the bus bar 90C overlaps with the non-facing portion 62C of the main terminal 60E. That is, the bus bar 90C faces the non-facing portion 62C that does not face the main terminal 600. Accordingly, as shown in FIG. 17, it is possible to cancel the magnetic fluxes generated when the main current in the opposite direction flows between the non-facing portion 62C of the main terminal 60E and the bus bar 90C. Thereby, the inductance of the main circuit wiring can be effectively reduced.

Figure 18:
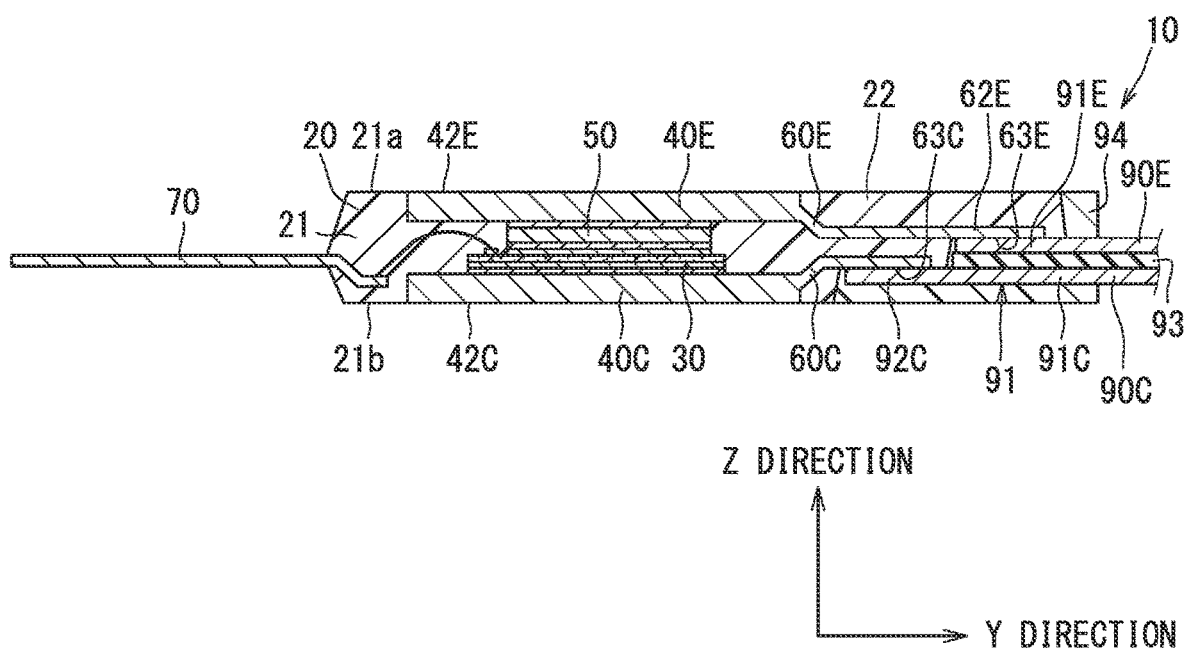
FIG. 18 is a cross-sectional view showing a modification.

As in a modification shown in FIG. 18, a secondary sealing body 94 may be provided in the semiconductor module 10. The secondary sealing body 94 seals the periphery of the connection portion between the main terminal 60 and the bus bar 90. The secondary sealing body 94 corresponds to a sealing member. The secondary sealing body 94 is formed after the sealing resin body 20 is molded. The secondary sealing body 94 is continuous from the terminal covering portion 22 of the sealing resin body 20. In such a configuration, the sealing resin body 20 may be referred to as a first sealing body.

As the secondary sealing body 94, an epoxy-based or silicone-based resin or gel can be used. As the secondary sealing body 94, a material different from that of the sealing resin body 20 may be used. In order to suppress peeling from the main terminal 60 and the bus bar 90, it is preferable to use a material having a lower elastic modulus than the sealing resin body 20. In order to suppress peeling, roughening treatment or primer treatment may be performed around the connection portion of the main terminal 60 and the bus bar 90. The toughing treatment includes laser irradiation, shot blasting, and the like. The primer treatment includes film formation of polyamide, polyimide, and the like.

In the above, the example in which the insulation member 93 such as an insulation paper is placed between the facing surfaces of the bus bars 90C and 90E has been shown. However, it is not limited to this. As in a modification shown in FIG. 19, the bus bar 90 covered with an insulation coating 95 such as enamel may be used. The thickness of the insulation coating 95 is, for example, in the range of several micrometers (μm) to several hundred micrometers.

The insulation coating 95 has an opening that exposes the connection portion of the bus bar 90 with the main terminal 60 and the back surface portion of the connection portion of the bus bar 90. The insulation coating 95 covering the bus bar 90E has an opening 95E. The insulation coating 95 covering the bus bar 90C has an opening 95C. A reference numeral of 96E shown in FIG. 19 indicates a joint portion between the bus bar 90E and the main terminal 60E, and a reference numeral of 96C indicates a joint portion between the bus bar 90C and the main terminal 60C. The joint portions 96C and 96E are formed by metal joint between the main terminal 60 and the bus bar 90.

Figure 19:
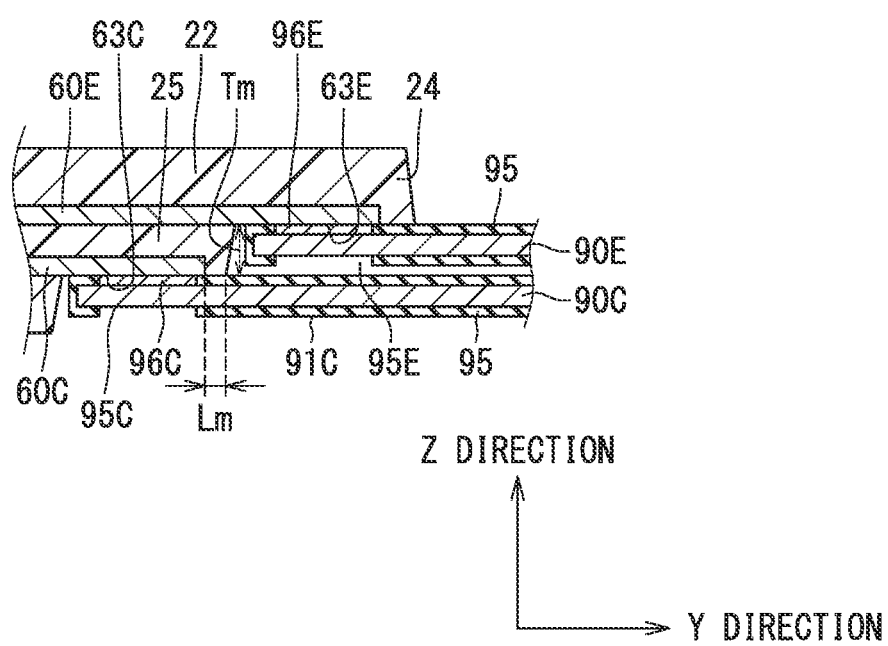
FIG. 19 is a cross-sectional view showing a modification.

In a structure shown in FIG. 19, the insulation coating 95 exists around the openings 95C and 95E. Thereby, a creepage distance between the E (emitter) potential and the C (collector) potential is determined by the sum of a thickness Tm and a length Lm. The thickness Tm is a length from the exposed portion 63E of the main terminal 60E to the insulation coating 95 covering the bus bar 90C along the Z direction. In other words, the thickness is the thickness of the second holding portion 25. The length Lm is a length from the exposed portion 63C of the main terminal 60C to a tip position of the second holding portion 25. The openings 95C and 95E are placed so as to be shifted in the Y direction, and the positions do not overlap each other in the projection view from the Z direction. Therefore, the creepage distance of the entire of the semiconductor module 10 including the bus bar 90 can be determined by the distance on the side of the main terminal 60. When the creepage distance is secured, for example, the length Lm may be increased. Thereby, it is possible to prevent the effect of reducing the inductance from being weakened.

The configuration shown as the third embodiment and its modification can be combined with the configuration shown as the preceding embodiment and its modification.

Other Embodiments

The example in which the semiconductor module 10 is applied to the inverter 5 has been shown. However, it is not limited to this. For example, the semiconductor module 10 can be applied to a converter. Further, the semiconductor module 10 can be also applied to both of the inverter 5 and the converter.

The example in which the IGBT 6i and the FWD 6d are integrally formed on the semiconductor element 30 has been shown. However, it is not limited to this. The IGBT 6i and the FWD 6d may be formed on separate chips.

The example in which the IGBT 6i is shown as the switching element formed at the semiconductor element 30 has been shown. However, it is not limited to this. For example, the MOSFET can be employed.

Although an example in which the terminal 50 is provided as the semiconductor module 10 having a double-sided heat radiation structure has been shown, the present disclosure is not limited to the above example. The terminal 50 may not be provided. For example, instead of the terminal 50, the heat sink 40E may be provided with a projection portion projecting toward the emitter electrode 31E.

Further, the example in which the heat dissipation surfaces 42C and 42E are exposed from the sealing resin body 20 has been shown. However, the heat dissipation surfaces 42C and 42E may not be exposed from the sealing resin body 20.

The example in which one semiconductor element 30 is placed between the heat sinks 40C and 40E has been shown. However, it is not limited to this. Multiple semiconductor elements 30 may be placed. For example, the multiple IGBTs 6i may be connected in parallel, so that one arm may be formed.

In the above, the embodiments, the configurations, the aspects of the semiconductor module according to the present disclosure are exemplified. The present disclosure is not limited to the above-described embodiments, each configuration and each aspect related to the present disclosure. For example, embodiments, configurations, and examples obtained from an appropriate combination of technical elements disclosed in different embodiments, configurations, and examples are also included within the scope of the embodiments, configurations, and examples of the present disclosure.

What is claimed is:

1. A semiconductor module comprising:
    a semiconductor element having one surface and a back surface opposite to the one surface, and including a first main electrode placed on the one surface and a second main electrode placed on the back surface;
    a conductive member placed to sandwich the semiconductor element, and including a first conductive member placed close to the one surface and connected to the first main electrode, and a second conductive member placed close to the back surface and connected to the second main electrode;
    a main terminal extending from the conductive member and including a first main terminal continuous from the first conductive member and a second main terminal continuous from the second conductive member; and
    a sealing resin body integrally sealing at least a part of each of the first conductive member and the second conductive member, a part of each of the first main terminal and the second main terminal, and the semiconductor element, wherein
    the main terminal has:
        a facing portion that is placed to cancel a magnetic flux generated when a main current flows, and is a portion where a plate surface of the first main terminal and a plate surface of the second main terminal face each other with a predetermined gap therebetween;
        a non-facing portion that is continuous from the facing portion of the first main terminal on a side opposite to the first conductive member; and
        a connection portion that includes a first connection portion formed on the plate surface of the first main terminal in the non-facing portion of the first main terminal, and a second connection portion formed on another plate surface of the second main terminal opposite to the plate surface facing the first main terminal and formed in at least the facing portion of the second main terminal,
    in a width direction orthogonal to an arrangement direction in which the facing portion and the non-facing portion of the first main terminal are arranged, a formation position of the second connection portion overlaps with a formation position of the first connection portion,
    the sealing resin body is interposed between the first main terminal and the second main terminal that form the facing portion,
    the second main terminal is placed to straddle the first main terminal in the width direction,
    the non-facing portion placed in the first main terminal is a first non-facing portion,
    the main terminal further includes a plurality of second non-facing portions that are continuous from both ends of the facing portion of the second main terminal in the width direction, and
    the first connection portion and the second connection portion are exposed from the sealing resin body as a connection region connected with an outside.

2. The semiconductor module according to claim 1, wherein
    in the width direction, a center of the first connection portion coincides with a center of the second connection portion.

3. The semiconductor module according to claim 1, wherein
    the plate surface on which the first connection portion is formed faces a same direction as the plate surface on which the second connection portion is formed.

4. The semiconductor module according to claim 1, wherein
    the sealing resin body includes a recess that opens on a surface opposite to a surface close to the connection portion and includes a first recess placed on the first non-facing portion and a second recess placed on the second non-facing portion.

5. The semiconductor module according to claim 1, wherein
    the second main terminal includes a notch in the second non-facing portion.

6. The semiconductor module according to claim 1, further comprising
    a bus bar connected to the connection portion of the main terminal and includes a first bus bar connected to the first main terminal and a second bus bar connected to the second main terminal, wherein
    the bus bar includes:
        a facing portion that is placed to cancel a magnetic flux generated when a main current flows, and is a portion where a plate surface of the first bus bar and a plate surface of the second bus bar face each other with a predetermined gap therebetween; and
        a non-facing portion that is continuous from the facing portion of the second bus bar and is connected to the second connection portion.

7. The semiconductor module according to claim 6, wherein
    in the second bus bar, the non-facing portion extends along the arrangement direction and at least a part extends from an end close to the non-facing portion among ends of the facing portion along the arrangement direction; and in a projection view from a direction orthogonal to the arrangement direction and the width direction, the second bus bar overlaps with the non-facing portion of the first main terminal.

8. The semiconductor module according to claim 6, further comprising a sealing member sealing a periphery of the connection portion between the main terminal and the bus bar.

9. The semiconductor module according to claim 6, further comprising an insulating coating covering the bus bar, and having an opening that exposes a connection portion of the bus bar with the main terminal and a back surface portion of the connection portion of the bus bar.

\* \* \* \* \*